United States Patent
Eun

(10) Patent No.: US 8,436,455 B2
(45) Date of Patent: May 7, 2013

(54) STACKED STRUCTURE OF SEMICONDUCTOR PACKAGES INCLUDING THROUGH-SILICON VIA AND INTER-PACKAGE CONNECTOR, AND METHOD OF FABRICATING THE SAME

(75) Inventor: Hyung-Lae Eun, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 277 days.

(21) Appl. No.: 12/900,968

(22) Filed: Oct. 8, 2010

(65) Prior Publication Data

US 2011/0127679 A1    Jun. 2, 2011

(30) Foreign Application Priority Data

Dec. 1, 2009    (KR) .................. 10-2009-0118035

(51) Int. Cl.
*H01L 23/02* (2006.01)
(52) U.S. Cl.
USPC ............... 257/686; 257/774; 257/E23.104; 257/E23.177; 257/E33.058; 257/E21.499
(58) Field of Classification Search .............. 257/774, 257/686, E23.104, E23.177, E33.058, E21.499
See application file for complete search history.

(56) References Cited

U.S. PATENT DOCUMENTS

| | | | |
|---|---|---|---|
| 6,577,013 B1 * | 6/2003 | Glenn et al. | 257/777 |
| 2004/0115863 A1 * | 6/2004 | Oyama | 438/106 |
| 2008/0105984 A1 | 5/2008 | Lee | |
| 2009/0096076 A1 * | 4/2009 | Jung | 257/686 |
| 2011/0298119 A1 * | 12/2011 | Cho et al. | 257/686 |

FOREIGN PATENT DOCUMENTS

| | | |
|---|---|---|
| JP | 2008-205381 | 9/2008 |
| KR | 10-0435813 | 6/2004 |
| KR | 1020080114030 | 12/2008 |

OTHER PUBLICATIONS

English Abstract for Publication No. 1020030046791 (for 10-0435813).
English Abstract for Publication No. 2008-205381.
English Abstract for Publication No. 1020080114030.

* cited by examiner

*Primary Examiner* — Long Tran
(74) *Attorney, Agent, or Firm* — F. Chau & Associates, LLC

(57) ABSTRACT

A stacked structure of semiconductor packages includes an upper semiconductor package, a lower semiconductor package and inter-package connectors. The upper semiconductor package includes an upper package substrate, a plurality of upper semiconductor chips stacked on the upper package substrate, and conductive upper connection lands formed on a bottom surface of the upper package substrate. The lower semiconductor package includes a lower package substrate, a plurality of lower semiconductor chips stacked on the lower package substrate, and lower through-silicon vias vertically penetrating the lower semiconductor chips. The inter-package connectors may electrically connect the through-silicon vias to the upper connection lands.

19 Claims, 24 Drawing Sheets

STACKED STRUCTURE OF SEMICONDUCTOR PACKAGES INCLUDING THROUGH-SILICON VIA AND INTER-PACKAGE CONNECTOR, AND METHOD OF FABRICATING THE SAME

CROSS-REFERENCE TO RELATED APPLICATION

This application claims priority under 35 U.S.C. §119 to Korean Patent Application No. 10-2009-0118035, filed on Dec. 1, 2009, the contents of which are hereby incorporated herein by reference in their entirety.

BACKGROUND

1. Technical Field

Exemplary embodiments of the present invention relate to a semiconductor package, and more particularly, to a stacked structure of a semiconductor package, a module, an electronic system, and a method of fabricating the same.

2. Discussion of Related Art

Semiconductor devices such as DRAM memory chips may be desired to have high speed and high capacity. Fabrication of such chips often involves various processes for forming the chips on a wafer, dividing the chips from the wafer and packaging each chip within a semiconductor package.

In performing chip fabrication, semiconductor chips and semiconductor packages may be stacked. Various methods have been developed for implementing these stacks, fabricating chips on a wafer, dividing the chips from the wafer and packaging the chips within the semiconductor package.

SUMMARY

Exemplary embodiments of the present invention provide a stacked structure of a semiconductor package including a through-silicon via and an inter-package connector.

Exemplary embodiments also provide a method of fabricating a stacked structure of a semiconductor package including a through-silicon via and an inter-package connector.

Exemplary embodiments further provide a semiconductor module including a stacked structure of a semiconductor package including a through-silicon via and an inter-package connector.

Exemplary embodiments further provide an electronic circuit board including a stacked structure of a semiconductor package including a through-silicon via and an inter-package connector.

Exemplary embodiments further provide an electronic system including a stacked structure of a semiconductor package including a through-silicon via and an inter-package connector.

According to exemplary embodiments of the present invention, a stacked structure of semiconductor packages includes an upper semiconductor package, a lower semiconductor package, and inter-package connectors. The upper semiconductor package includes an upper package substrate, a plurality of upper semiconductor chips stacked on the upper package substrate, and conductive upper connection lands formed on a bottom surface of the upper package substrate. The lower semiconductor package includes a lower package substrate, a plurality of lower semiconductor chips stacked on the lower package substrate, and lower through-silicon vias vertically penetrating the lower semiconductor chips. The inter-package connectors electrically connect the through-silicon vias to the upper connection lands.

According exemplary embodiments, a stacked structure of semiconductor packages includes an upper semiconductor package, a lower semiconductor package, and inter-package connectors. The upper semiconductor package includes an upper package substrate, a plurality of upper semiconductor chips stacked on the upper package substrate, upper through-silicon vias vertically penetrating the upper semiconductor chips, and conductive upper connection lands formed on a bottom surface of the upper package substrate. The conductive upper connection lands, the upper through-silicon vias, and the upper semiconductor chips are electrically connected to each other. The lower semiconductor package includes a lower package substrate, a plurality of lower semiconductor chips stacked on the lower package substrate, lower through-silicon vias vertically penetrating the lower semiconductor chips and electrically insulated from the lower semiconductor chips, via pads formed on a surface of an uppermost semiconductor chip stacked on the uppermost part of the lower semiconductor chips and electrically connected to the lower through-silicon vias, and a lower molding material including openings covering an upper part of the lower package substrate and a side and an upper part of the lower semiconductor chips and exposing surfaces of the via pads. The inter-package connectors are formed in the openings, and electrically connect the uppermost via pads to the upper connection lands.

According to exemplary embodiments, a semiconductor module includes a module substrate, a plurality of semiconductor devices disposed on the module substrate, and module contact terminals formed parallel to an edge of the module substrate and electrically connected to the semiconductor devices. At least one of the semiconductor devices includes the stacked structure of semiconductor packages described above.

According to exemplary embodiments, an electronic system includes a control unit, an input unit, an output unit, and a storage unit. At least one of the control unit, the input unit, the output unit, and the storage unit includes the stacked structure of semiconductor packages described above.

According to exemplary embodiments, a method of forming semiconductor packages includes forming an upper semiconductor package, forming a lower semiconductor package, and stacking the upper and lower semiconductor packages such that the lower semiconductor package is electrically connected to the upper semiconductor package through an inter-package connector. Forming the upper semiconductor package includes forming upper semiconductor chips in a wafer state, stacking the upper semiconductor chips on the upper package substrate having upper connection lands on its bottom surface, and forming an upper molding material surrounding the upper semiconductor chips. Forming the lower semiconductor package includes forming the lower semiconductor chips in a wafer state, forming lower through-silicon vias vertically penetrating the lower semiconductor chips, stacking the lower semiconductor chips such that the lower through-silicon vias are arranged on a lower package substrate, and forming an upper molding material surrounding the stacked lower semiconductor chips. Stacking the upper and lower semiconductor packages such that the lower semiconductor package is electrically connected to the upper semiconductor package through the inter-package connectors includes forming openings electrically exposing a part of the through-silicon via included in the lower semiconductor chip in the lower molding material and forming an inter-package connector filling the opening and electrically connecting the upper connection lands to the lower through-silicon via.

Discussion of exemplary embodiments of the present invention are included in the detailed description and drawings.

BRIEF DESCRIPTION OF THE DRAWINGS

Exemplary embodiments of the present invention are described in further detail below with reference to the accompanying drawings. It should be understood that various aspects of the drawings may have been exaggerated for clarity. In the drawings.

DETAILED DESCRIPTION OF THE EXEMPLARY EMBODIMENTS

Figure 1:
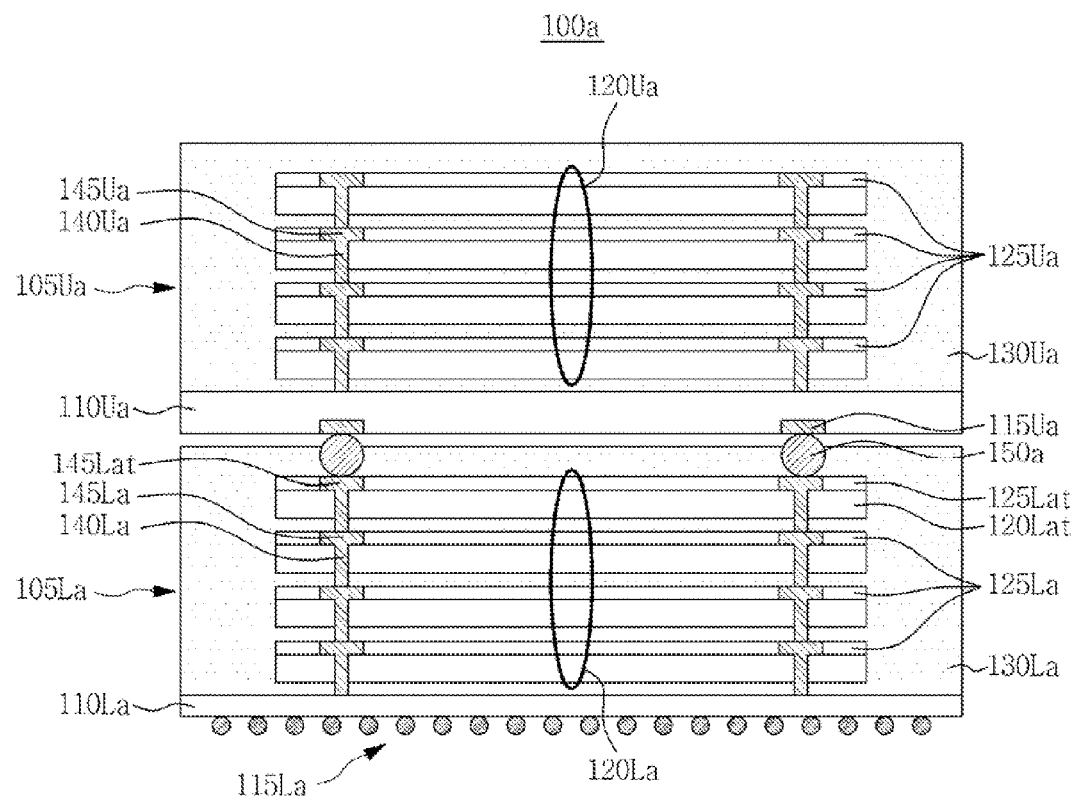
FIG. 1 is a schematic cross-sectional view of a stacked structure of semiconductor packages according to an exemplary embodiment of the present invention.

Exemplary embodiments of the present invention will now be described more fully with reference to the accompanying drawings. The inventive concept may, however, be embodied in different forms and should not be construed as limited to the embodiments set forth herein. In the drawings, the sizes and relative sizes of layers and regions may be exaggerated for clarity. When any element of the inventive disclosure appears in more than one drawing, it may be denoted by the same reference numeral in each drawing.

Exemplary embodiments of the inventive disclosure may be described with reference to schematic plan views or cross-sectional views, which may be schematic views of idealized exemplary embodiments of the inventive disclosure. Thus, the regions illustrated in the drawings are schematic in nature and are not intended to limit the scope of the inventive disclosure.

FIG. 1 is a schematic cross-sectional view of a stacked structure of semiconductor packages according to an exemplary embodiment of the present invention. Referring to FIG. 1, a stacked structure 100a of semiconductor packages includes a lower semiconductor package 105La, an upper semiconductor package 105Ua, and inter-package connectors 150a. The inter-package connectors 150a may electrically connect the lower semiconductor package 105La to the upper semiconductor package 105Ua. The lower semiconductor package 105La includes a lower package substrate 110La, a plurality of lower semiconductor chips 120La, a lower molding material 130La and lower through-silicon vias 140La.

The lower package substrate 110La may be a substrate for a package and may be fabricated with a metal, ceramic, plastic, glass or a printed circuit board. Pads electrically connected to the lower through-silicon vias 140La may be formed on a top surface of the lower package substrate 110La. The pads are omitted from the drawings for simplicity.

Circuit bumps 115La may be formed on a bottom surface of the lower package substrate 110La. The circuit bumps 115La may electrically connect the stacked structure 100a of semiconductor packages to a module board or a circuit board (not shown). The circuit bumps 115La may be electrically connected to the lower through-silicon vias 140La. The circuit bumps 115La may be formed using a soldering process.

The lower through-silicon vias 140La may be electrically connected to the circuit bumps 115La through the pads formed on the top surface of the lower package substrate 110La and conductive lines (not shown) that are formed in the lower package substrate 110La.

The plurality of lower semiconductor chips 120La may be in a wafer state. For example, they may have to be separated from a wafer through a sawing processes to be divided into individual chips. The lower semiconductor chips 120La may be, for example, memory chips. The lower semiconductor chips 120La will be described herein as DRAM chips, although the invention is not be limited to such an example.

The lower molding material 130La may be formed on the lower package substrate 110La and may be formed to surround the lower semiconductor chips 120La. The lower molding material 130La may be formed, for example, of an epoxy-based resin.

The lower through-silicon vias 140La may vertically penetrate the lower semiconductor chips 120La. The lower through-silicon vias 140La may be electrically connected to the lower package substrate 110La. The lower through-silicon vias 140La may include lower via pads 145La. The lower via pads 145La may be formed on top surfaces of the lower semiconductor chips 120La. Alternatively, the lower via pads 145La may be included in lower chip redistribution layers 125La formed on the top surfaces of the lower semiconductor chips 120La. The lower chip redistribution layers 125La may be formed on the top surfaces of the lower semiconductor chips 120La, respectively.

The upper semiconductor package 105Ua includes an upper package substrate 110Ua, a plurality of upper semiconductor chips 120Ua, an upper molding material 130Ua and upper through-silicon vias 140Ua.

The upper package substrate 110Ua may be a substrate for a package and may be fabricated with a metal, ceramic, plastic, glass or a printed circuit board. Upper connection lands 115Ua may be formed below the upper package substrate 110Ua. The upper connection lands 115Ua may be electrically and physically connected to the inter-package connectors 150a. Further, the upper connection lands 115Ua may be electrically connected to the upper through-silicon vias 140Ua. The upper connection lands 115Ua may be formed in the upper package substrate 110Ua, and may be formed such that a surface may be partially exposed to the outside. Alternatively, the upper connection lands 115Ua may be formed to protrude to the outside of the upper package substrate 110Ua Pads electrically connected to the upper through-silicon vias 140Ua may be formed on a top surface of the upper package substrate 110Ua. The pads (not shown) are omitted from the drawing for simplicity. The upper through-silicon vias 140Ua may be electrically connected to the upper connection lands 115Ua, respectively, through the pads formed on the top surface of the upper package substrate 110Ua and conductive lines (not shown) formed in the upper package substrate 110Ua.

The upper semiconductor chips 120Ua may be in a wafer state. For example, they may have to be separated from a wafer through sawing processes to be divided into individual chips. The upper semiconductor chips 120Ua may be memory chips. The exemplary embodiment will be described based on the assumption that the upper semiconductor chips 120Ua are flash memory chips.

The upper molding material 130Ua may be formed on the upper package substrate 110Ua and may be formed to fully surround the upper semiconductor chips 120Ua. The upper molding material 130Ua may be formed of an epoxy-based resin.

The upper through-silicon vias 140Ua may vertically penetrate the upper semiconductor chips 120Ua. The upper through-silicon vias 140Ua may be electrically connected to the upper package substrate 110Ua. The upper through-silicon vias 140Ua may include upper via pads 145Ua. The upper via pads 145Ua may be formed on top surfaces of the upper semiconductor chips 120Ua. Alternatively, the upper via pads 145Ua may be included in upper chip redistribution layers 125Ua formed on the top surfaces of the upper semiconductor chips 120Ua. The upper chip redistribution layers 125Ua may be formed on the top surfaces of the upper semiconductor chips 120Ua, respectively.

The inter-package connectors 150a may electrically connect uppermost via pads 145Lat of an uppermost lower semiconductor chip 120Lat disposed on the uppermost part of the lower semiconductor package 105La to the upper connection lands 115Ua. The inter-package connectors 150a may be formed using a soldering process. For example, the inter-package connectors 150a may be in the shape of a ball. Each of the uppermost via pads 145Lat may be formed in an uppermost chip redistribution layer 125Lat of the uppermost lower semiconductor chip 120Lat.

In the exemplary embodiment, a layout of the uppermost via pads 145Lat of the uppermost lower semiconductor chip 120Lat of the lower semiconductor package 105La may coincide with or mirror that of the upper connection lands 115Ua of the upper package substrate 110Ua. Here, mirroring means that the layout may be formed in a symmetrical manner like reflection in a mirror. For example, the uppermost via pads 145Lat of the uppermost lower semiconductor chip 120Lat of the lower semiconductor package 105La may be vertically arranged with respect to the upper connection lands 115Ua of the upper package substrate 110Ua of the upper semiconductor package 105Ua, respectively. The layout of the upper connection lands 115Ua may be coincident with that of the inter-package connectors 150a. The layout of the inter-package connectors 150a may be similar to that of the uppermost via pads 145Lat.

Figure 2:
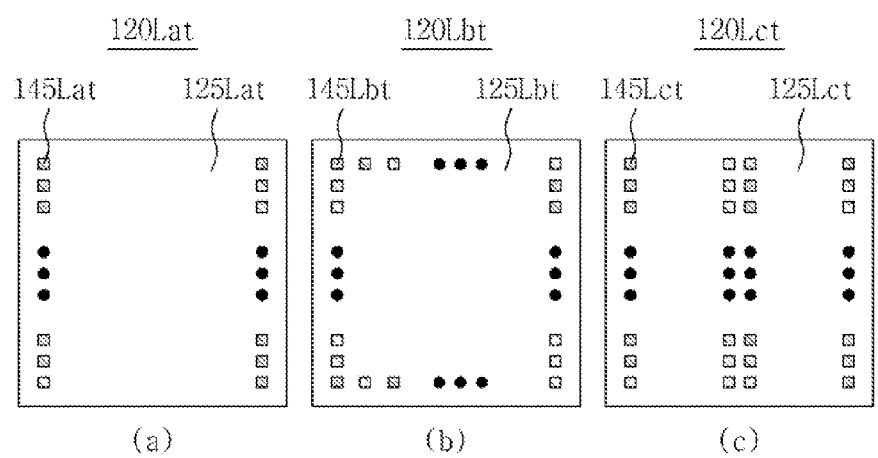
FIG. 2 is a schematic diagrams illustrating top surfaces of uppermost lower semiconductor chips disposed on the uppermost part of a lower semiconductor package according to an exemplary embodiment of the present invention.

FIG. 2 is a schematic illustrating top surfaces of uppermost lower semiconductor chips disposed on the uppermost part of a lower semiconductor package according to an exemplary embodiment of the present invention. Specifically, schematic (a) illustrates that the uppermost via pads 145Lat are arranged at both outer parts of the uppermost chip redistribution layer 125Lat of the uppermost lower semiconductor chip 120Lat of FIG. 1. Schematic (b) illustrates that uppermost via pads 145Lbt are arranged at four outer parts of an uppermost chip redistribution layer 125Lbt of an uppermost lower semiconductor chip 120Lbt. Schematic (c) illustrates that uppermost via pads 145Lct are arranged at both outer parts and intermediate parts of an uppermost chip redistribution layer 125Lct of an uppermost lower semiconductor chip 120Lct. Furthermore, uppermost via pads 145Lct may be arranged in various forms such as in the form of a mixture of schematic (b) and schematic (c) or a lattice-type grid array.

Figure 3A:
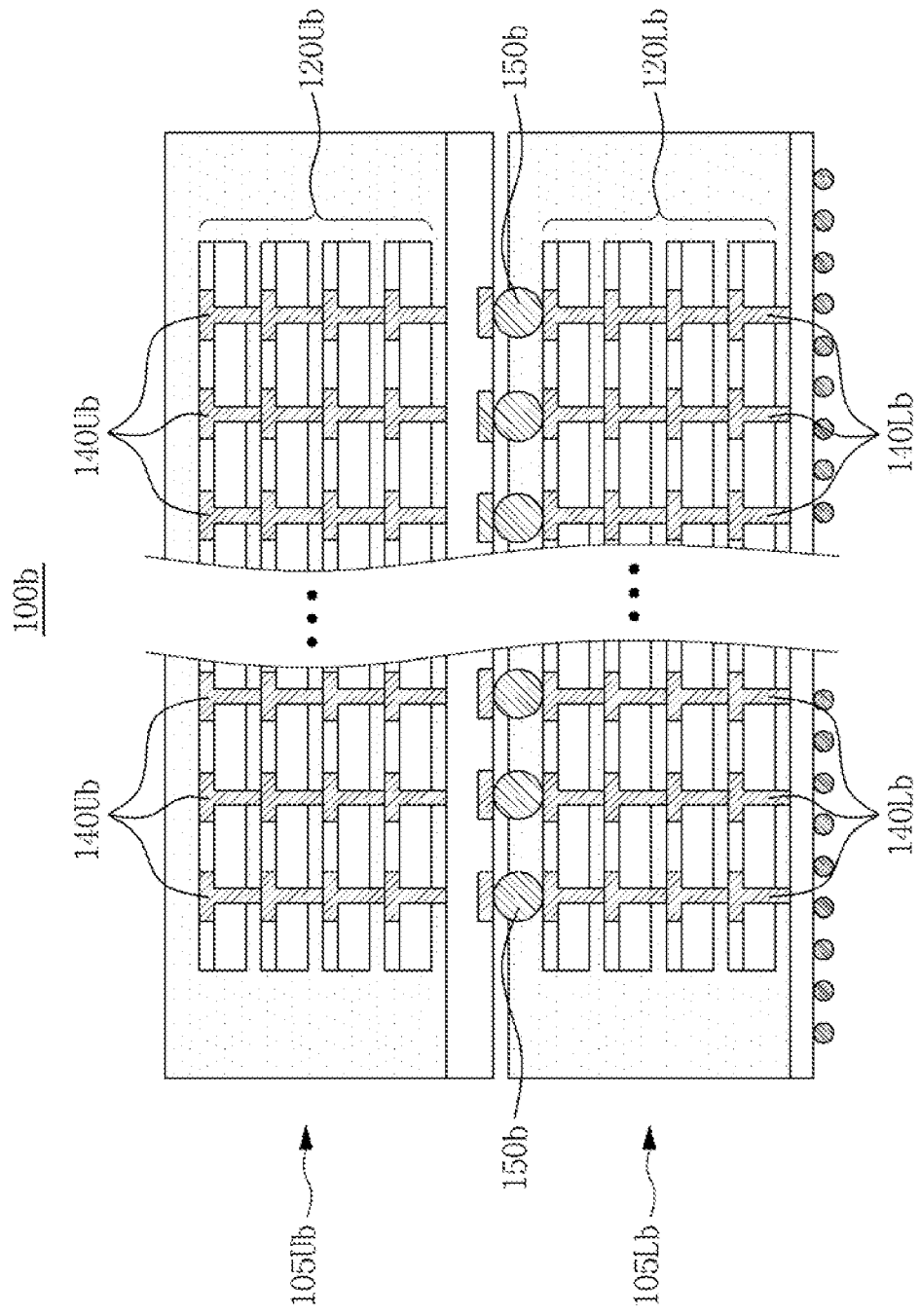
FIGS. 3A and 3B are schematic diagrams illustrating a stacked structure of various semiconductor packages according to exemplary embodiments of the present invention.
Figure 3B:
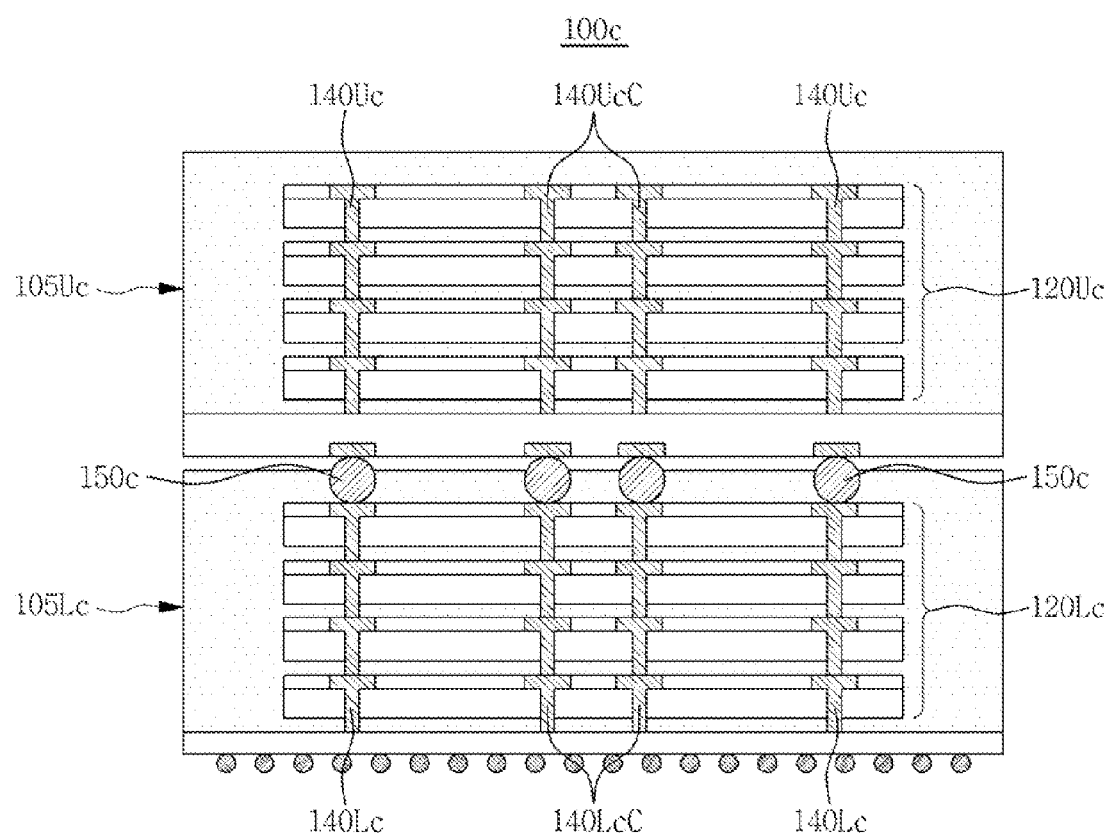

FIGS. 3A and 3B are schematic diagrams of a stacked structure of various semiconductor packages according to an exemplary embodiment of the present invention. For example, FIG. 3A illustrates that a stacked structure 100b of semiconductor packages may include the uppermost lower semiconductor chip 120Lbt illustrated in schematic (b) of FIG. 2, and FIG. 3B illustrates that a stacked structure 100c of semiconductor packages may include the uppermost lower semiconductor chip 120Lct illustrated in schematic (c) of FIG. 2.

Referring to FIG. 3A, a stacked structure 100b of semiconductor packages may include a lower semiconductor package 105Lb, an upper semiconductor package 105Ub, and inter-package connectors 150b. The lower semiconductor package 105Lb may include a plurality of stacked lower semiconductor chips 120Lb and a plurality of lower through-silicon vias 140Lb formed at outer parts of the lower semiconductor chips 120Lb at regular intervals. The upper semiconductor package 105Ub may include a plurality of stacked upper semiconductor chips 120Ub and a plurality of upper through-silicon vias 140Ub formed at outer parts of the upper semiconductor chips 120Ub at regular intervals.

Referring to FIG. 3B, a stacked structure 100c of semiconductor packages includes a lower semiconductor package 105Lc, an upper semiconductor package 105Uc, and inter-package connectors 150c. The lower semiconductor package 105Lc may include lower semiconductor chips 120Lc including lower through-silicon vias 140Lc and 140LcC arranged at outer parts and intermediate parts, respectively. The upper semiconductor package 105Uc may include upper semiconductor chips 120Uc including a plurality of upper through-silicon vias 140Uc and 140UcC arranged at outer parts and intermediate parts, respectively.

FIGS. 4A to 4K are schematic cross-sectional views of stacked structures of semiconductor packages according to various exemplary embodiments of the present invention. The stacked structures 100d to 100n of semiconductor packages include lower semiconductor packages 105Ld to 105Ln, upper semiconductor packages 105Ud to 105Un, and inter-package connectors 150c to 150n. The inter-package connectors 150d to 150n may electrically connect the lower semiconductor packages 105Ld to 105Ln to the upper semiconductor packages 105Ud to 105Un, respectively.

Figure 4A:
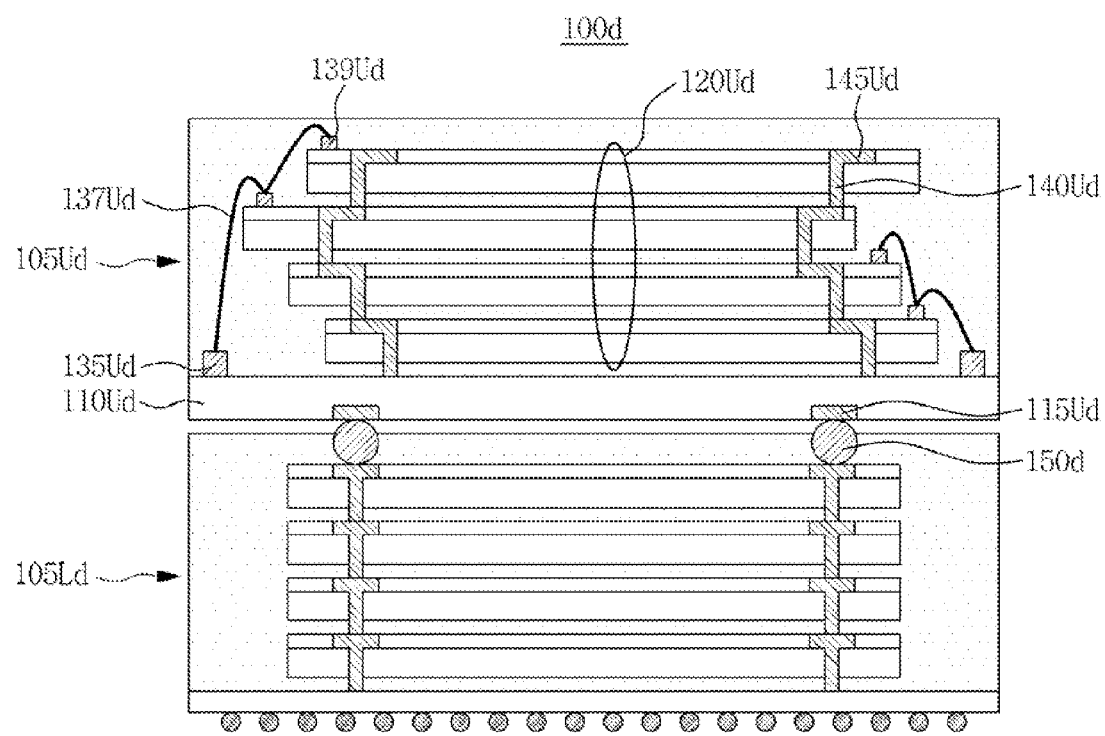
FIGS. 4A to 4K are schematic cross-sectional views of stacked structures of semiconductor packages according exemplary embodiments of the present invention.

Referring to FIG. 4A, the upper semiconductor package 105Ud includes an upper package substrate 110Ud and a plurality of stacked upper semiconductor chips 120Ud. The upper package substrate 110Ud may include upper connection lands 115Ud and upper wire lands 135Ud. The upper semiconductor chips 120Ud may include upper through-silicon vias 140Ud, upper via pads 145Ud and upper bonding pads 139Ud. The upper wire lands 135Ud may be electrically connected to the upper bonding pads 139Ud through upper bonding wires 137Ud. One side of the upper semiconductor chips 120Ud need not be arranged vertically. This may expose the upper bonding pads 139Ud. Here, the upper through-silicon vias 140Ud need not be arranged vertically. The upper through-silicon vias 140Ud may be electrically connected to each other through the upper via pads 145Ud. The upper through-silicon vias 140Ud may be electrically connected to the upper package substrate 110Ud through conductive pads that are not shown. The upper through-silicon vias 140Ud and/or the upper wire lands 135Ud may be electrically connected to the upper connection lands 115Ud, respectively.

Figure 4B:
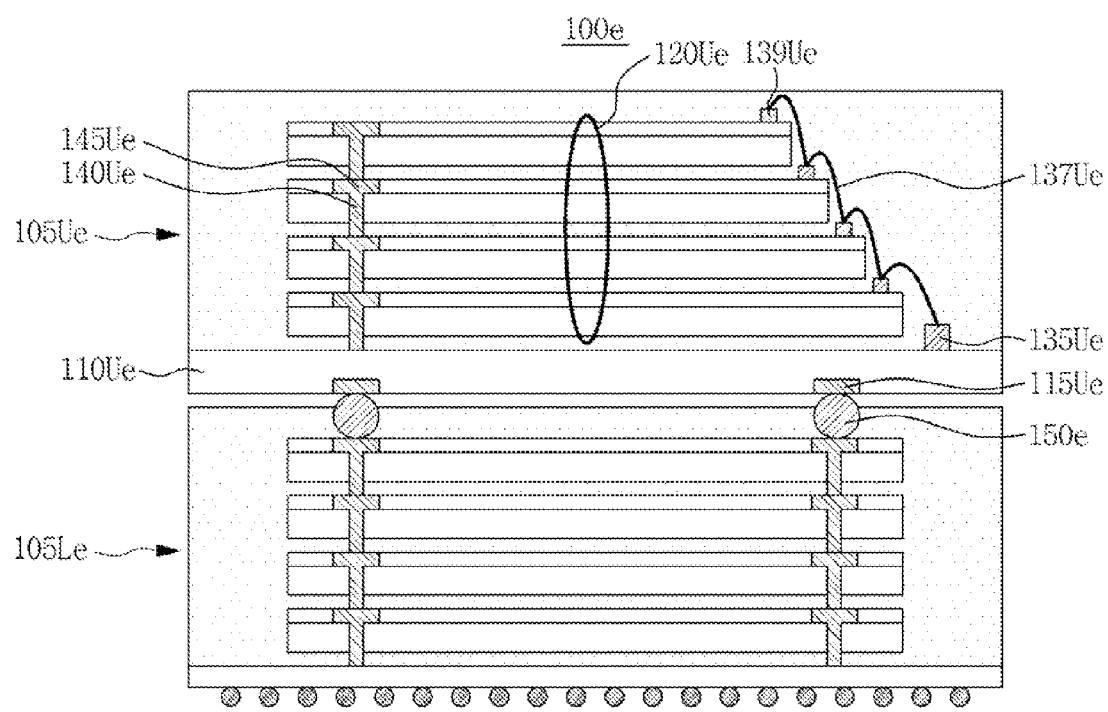

Referring to FIG. 4B, an upper semiconductor package 105Ue includes an upper package substrate 110Ue, and a plurality of stacked upper semiconductor chips 120Ue. The upper package substrate 110Ue may include upper connection lands 115Ue and upper wire lands 135Ue. The upper semiconductor chips 120Ue may include upper through-silicon vias 140Ue, upper via pads 145Ue and upper bonding pads 139Ue. The upper wire lands 135Ue may be electrically connected to the upper bonding pads 139Ue through upper bonding wires 137Ue. One side of the upper semiconductor chips 120Ue may be arranged vertically and the other side need not be arranged vertically. When the upper bonding pads 139Ue are formed at only one outer part of the upper semiconductor chips 120Ue, the upper bonding pads 139Ue may be exposed. Here, the upper through-silicon vias 140Ue may be arranged vertically. While it is illustrated that the upper semiconductor chips 120Ue are stacked like steps, this is shown as an example. For example, the upper semiconductor chips 120Ue in the direction of the other side might not be stacked like steps. Therefore, it may be understood that the upper semiconductor chips 120Ue include at least one upper through-silicon via 140Ue and the upper through-silicon vias 140Ud are arranged vertically.

Figure 4C:
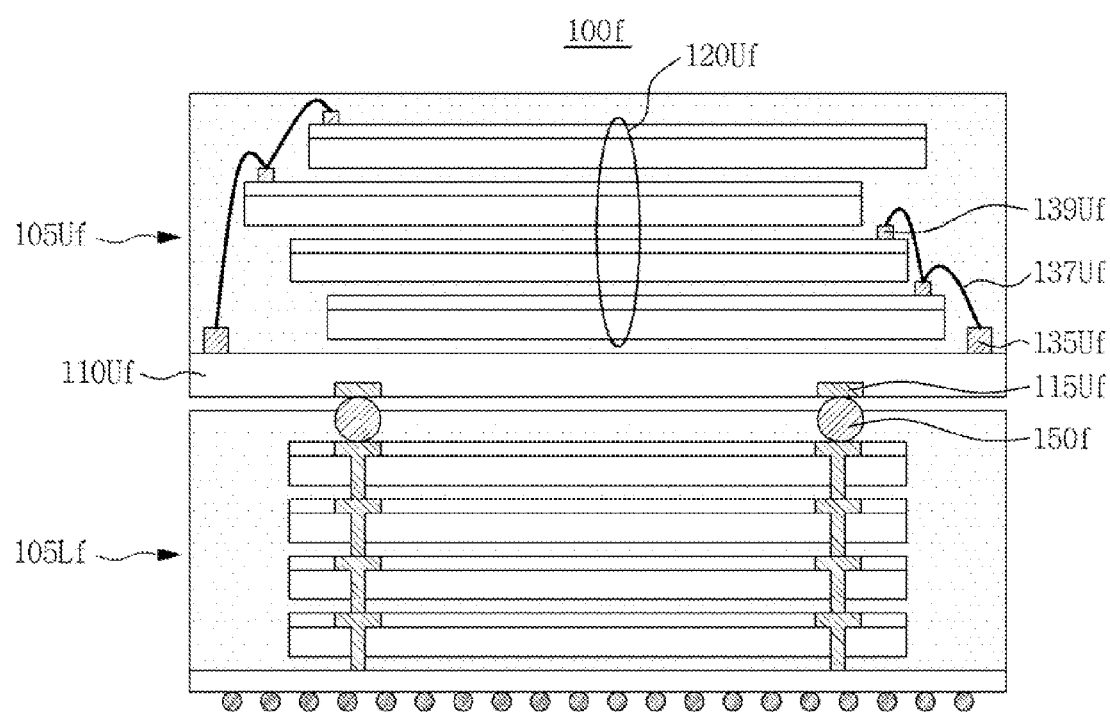

Referring to FIG. 4C, an upper semiconductor package 105Uf includes an upper package substrate 110Uf and a plurality of stacked upper semiconductor chips 120Uf. The upper package substrate 110Uf may include upper connection lands 115Uf and upper wire lands 135Uf. The upper semiconductor chips 120Uf may include upper bonding pads 139Uf. The upper wire lands 135Uf may be electrically connected to the upper bonding pads 139Uf through upper bonding wires 137Uf. Both sides of the upper semiconductor chips 120Uf need not be arranged vertically. Accordingly, the upper bonding pads 139Uf may be exposed. The upper semiconductor chips 120Uf need not include upper through-silicon vias. Alternatively, combining with or making with reference to FIG. 4B, it may be understood that the upper semiconductor chips 120Uf may be stacked from side to side in a variety of biased manners to expose the upper bonding pads 139Uf. For example, the upper through-silicon vias 140Ue of FIG. 4B may be omitted from FIG. 4C.

Figure 4D:
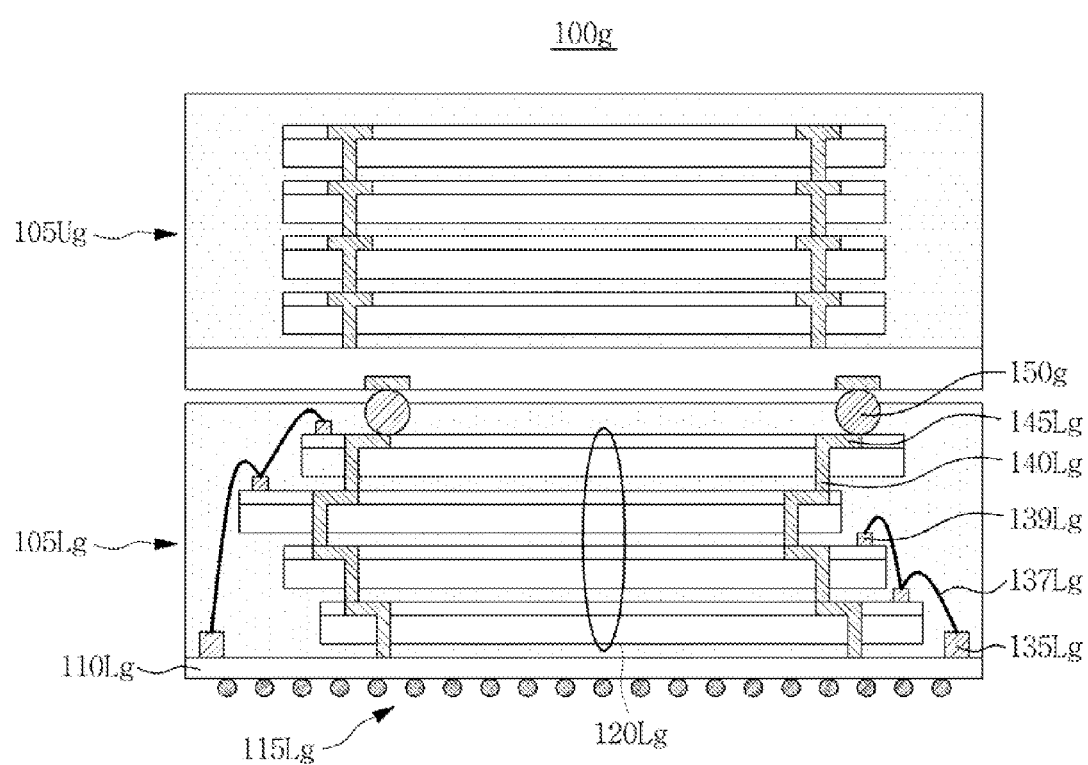

Referring to FIG. 4D, a lower semiconductor package 105Lg includes a lower package substrate 110Lg and a plurality of stacked lower semiconductor chips 120Lg. The lower package substrate 110Lg may include circuit bumps 115Lg and lower wire lands 135Lg. The lower semiconductor chips 120Lg may include lower through-silicon vias 140Lg, lower via pads 145Lg and lower bonding pads 139Lg. The lower wire lands 135Lg may be electrically connected to the lower bonding pads 139Lg through lower bonding wires 137Lg. One side of the lower semiconductor chips 120Lg need not be arranged vertically. Accordingly, the lower bonding pads 139Lg may be exposed. Here, the lower through-silicon vias 140Lg need not be arranged vertically. Other elements that are not described may be understood with reference to FIG. 4A.

Figure 4E:
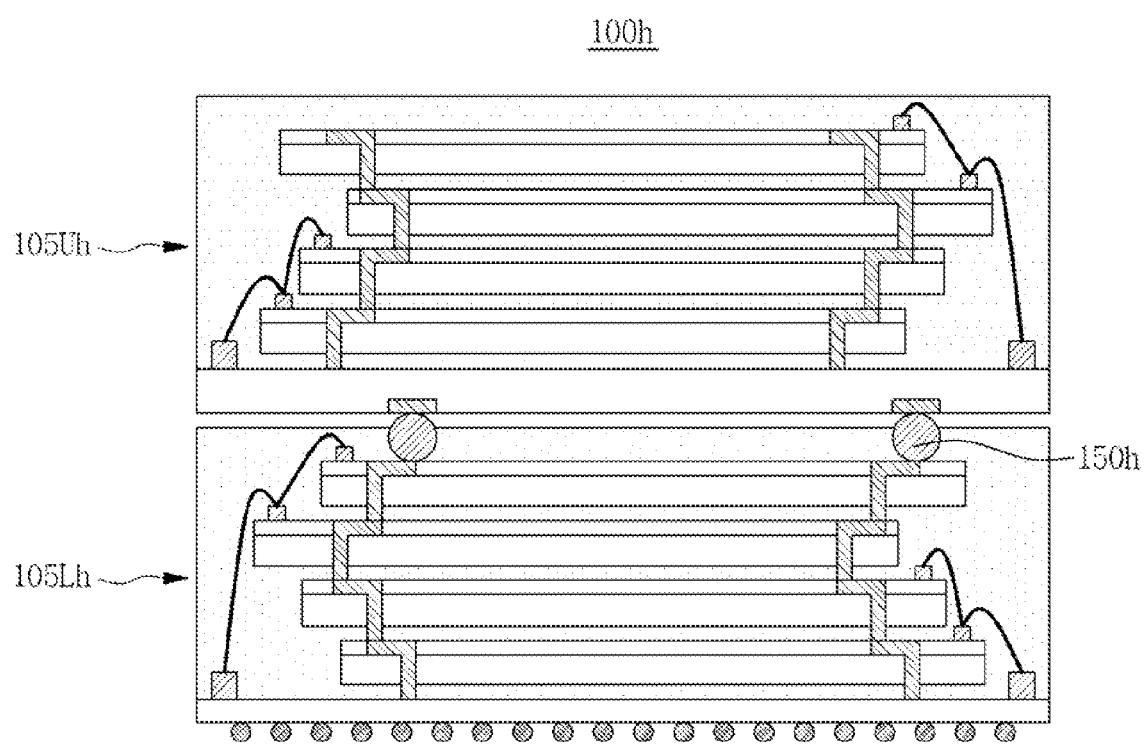

Referring to FIG. 4E, an upper semiconductor package 105Uh may be understood with reference to the upper semiconductor package 105Ud illustrated in FIG. 4A, and a lower semiconductor package 105Lh may be understood with reference to the lower semiconductor package 105Lg of FIG. 4D.

Figure 4F:
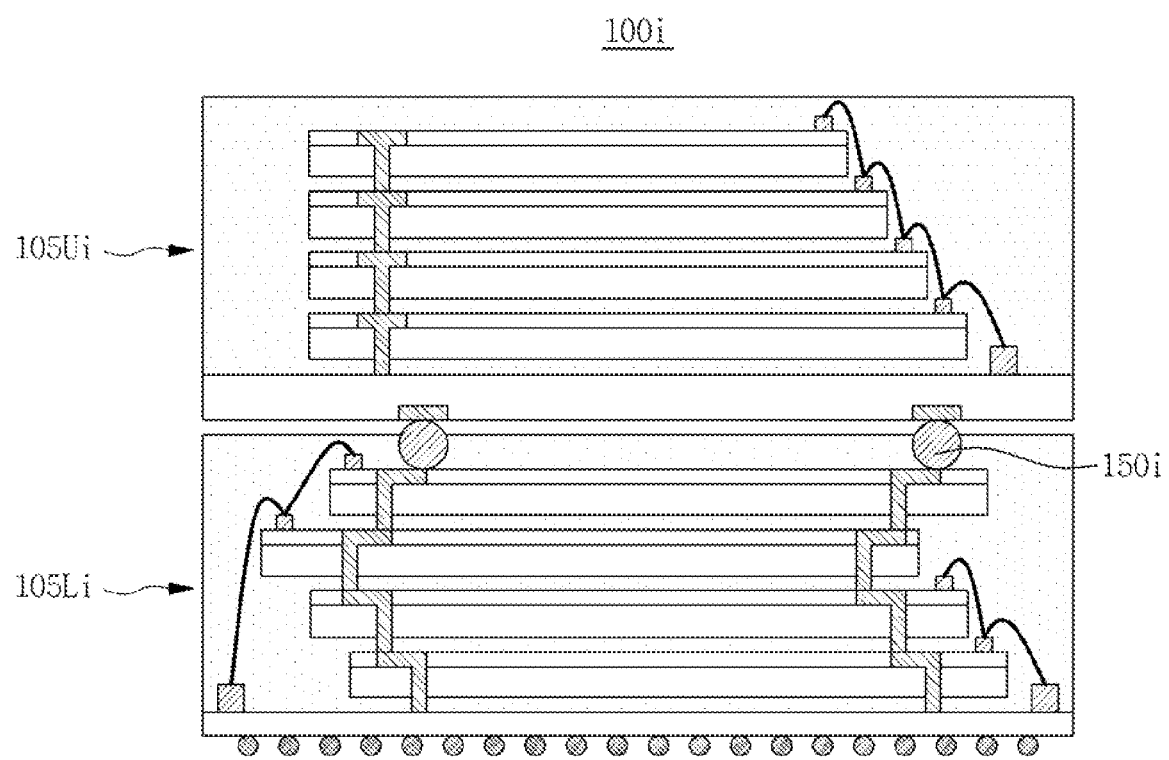

Referring to FIG. 4F, an upper semiconductor package 105Ui may be understood with reference to the upper semiconductor package 105Ue illustrated in FIG. 4B, and a lower semiconductor package 105Li may be understood with reference to lower semiconductor packages 105Lg and 105Lh of FIGS. 4D and 4E.

Figure 4G:
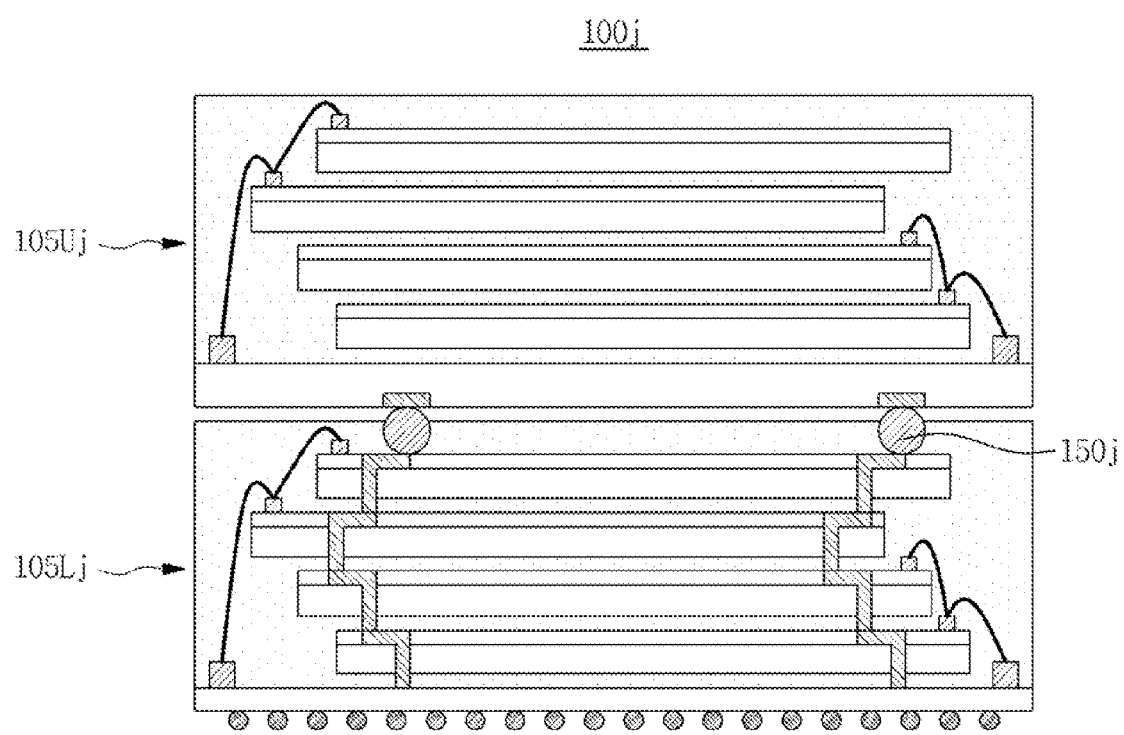

Referring to FIG. 4G, an upper semiconductor package 105Uj may be understood with reference to FIG. 4C, and a lower semiconductor package 105Lj may be understood with reference to lower semiconductor packages 105Lg, 105Lh and 105Li of FIGS. 4E and 4F.

Figure 4H:
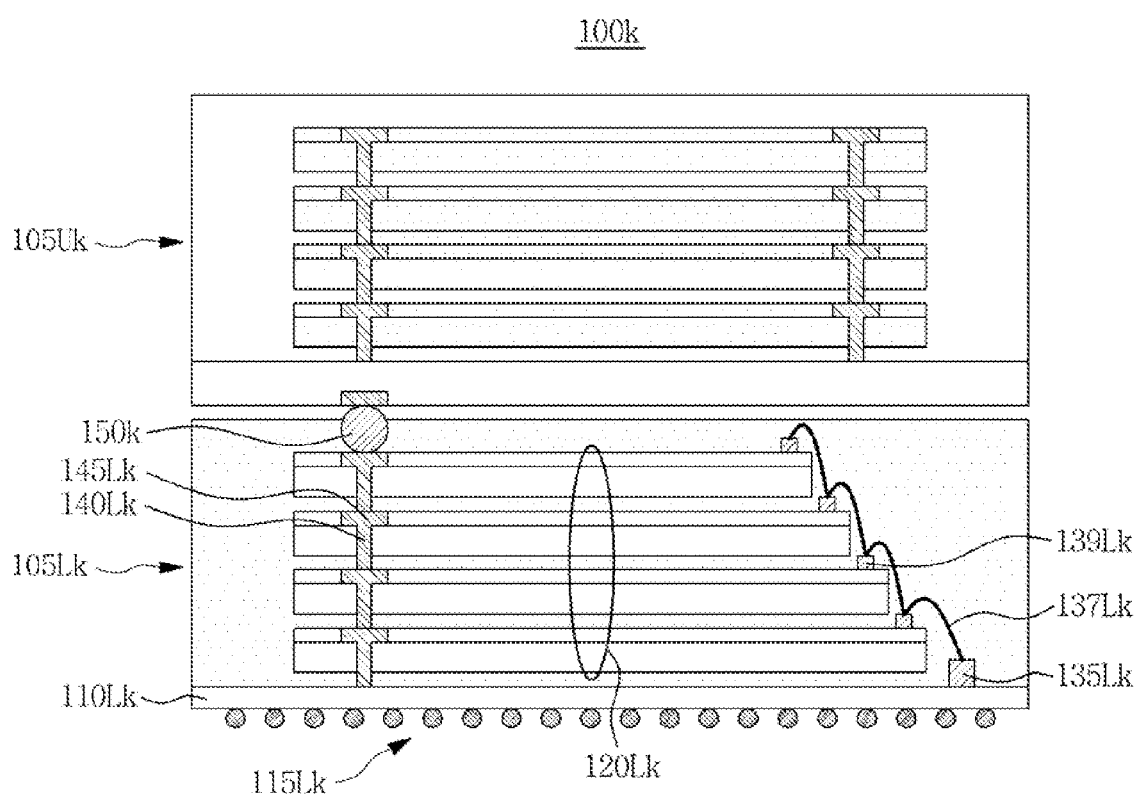

Referring to FIG. 4H, an upper semiconductor package 105Uk may be understood with reference to the upper semiconductor package 105Ua illustrated in FIG. 1. The lower semiconductor package 105Lk includes a lower package substrate 110Lk and a plurality of stacked lower semiconductor chips 120Lk. The lower package substrate 110Lk may include circuit bumps 115Lk and lower wire lands 135Lk. The lower semiconductor chips 120Lk may include lower through-silicon vias 140Lk, lower via pads 145Lk and lower bonding pads 139Lk. The lower wire lands 135Lk may be electrically connected to the lower bonding pads 139Lk through the lower bonding wires 137Lk. One side of the lower semiconductor chips 120Lk may be arranged vertically and the other side need not be arranged vertically. When the lower bonding pads 139Lk are formed at only one outer part of the lower semiconductor chips 120Lk, the lower bonding pads 139Lk may be exposed. Here, the lower through-silicon vias 140Lk may be arranged vertically. While it is illustrated that the lower semiconductor chips 120Lk are stacked like steps, this is intended as an exemplary embodiment and the invention is not limited to this particular configuration. For example, the lower semiconductor chips 120Lk in the direction of the other side might not be stacked like steps. Therefore, the exemplary embodiment may be understood that each of the lower semiconductor chips 120Lk includes at least one lower through-silicon via 140Lk and the lower through-silicon vias 140Lk may be arranged vertically.

Figure 4I:
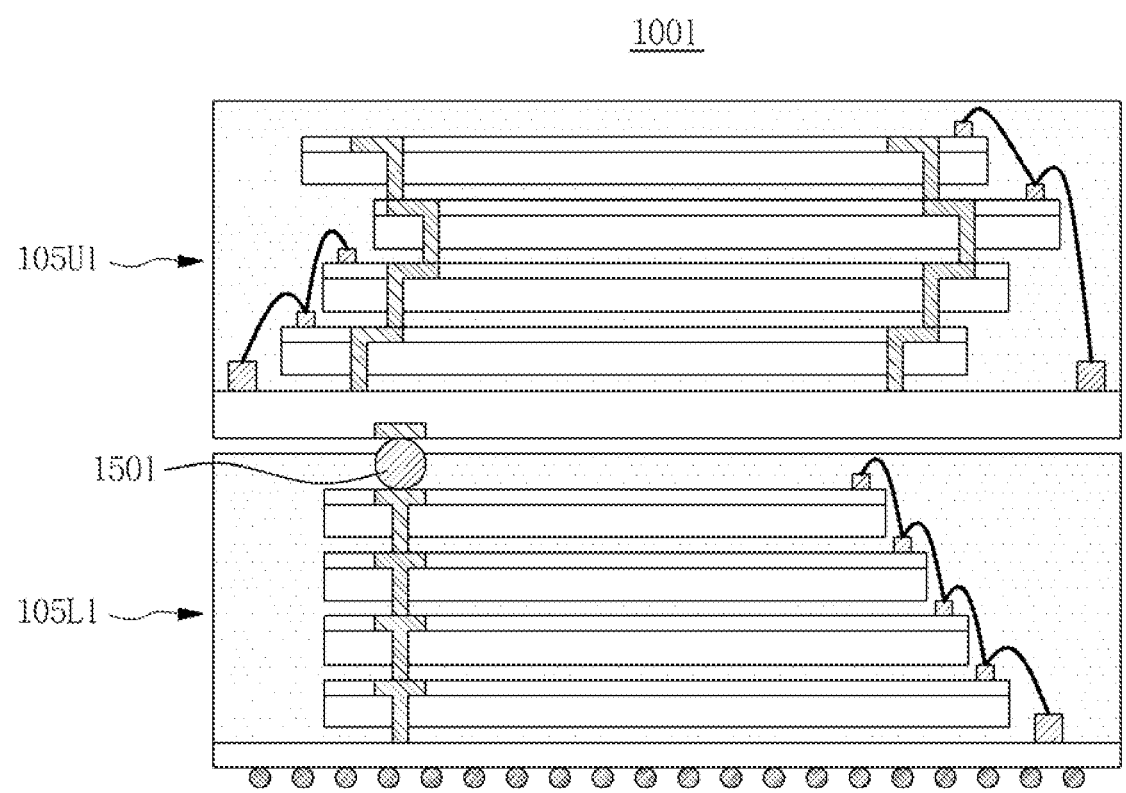

Referring to FIG. 4I, an upper semiconductor package 105Ul may be understood with reference to upper semiconductor packages 105Ud and 105Uh of FIGS. 4A and 4E and a lower semiconductor package 105Ll may be understood with reference to the lower semiconductor package 105Lk of FIG. 4H.

Figure 4J:
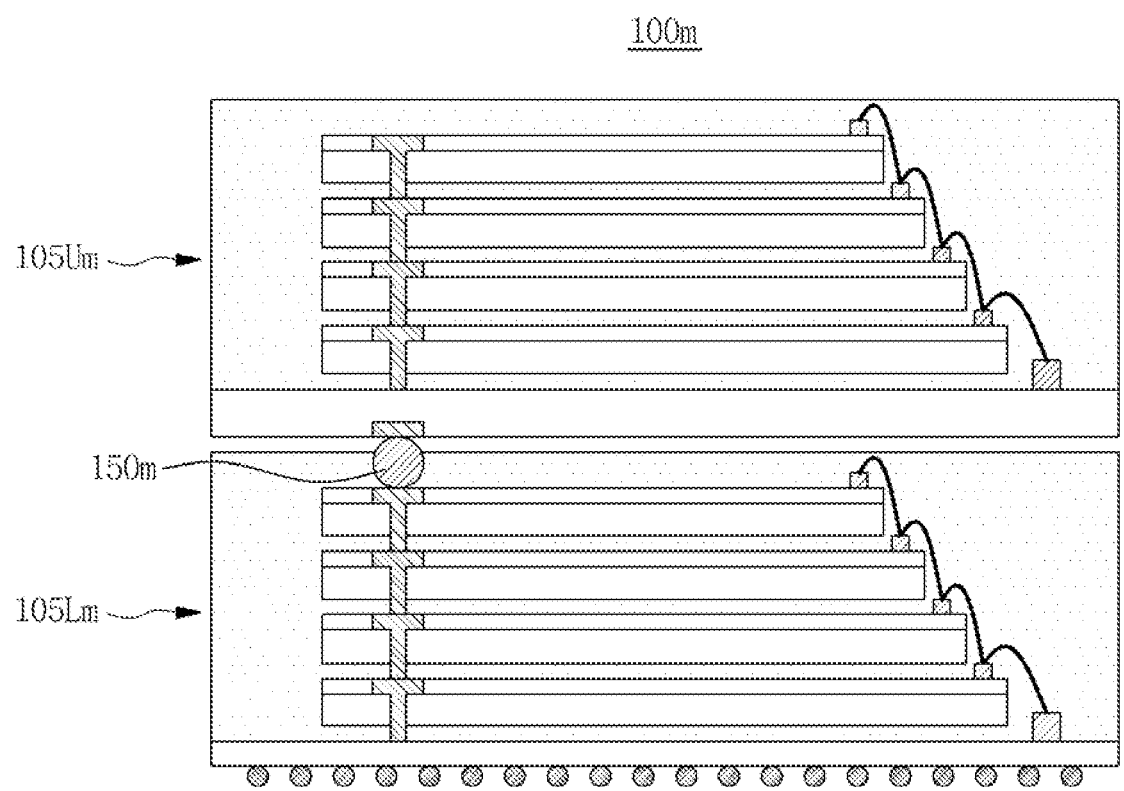

Referring to FIG. 4J, an upper semiconductor package 105Um may be understood with reference to upper semiconductor packages 105Ue and 105Ui illustrated in FIGS. 4B and 4F and a lower semiconductor package 105Lm may be understood with reference to lower semiconductor packages 105Lk and 105Ll illustrated in FIGS. 4H and 4I.

Figure 4K:
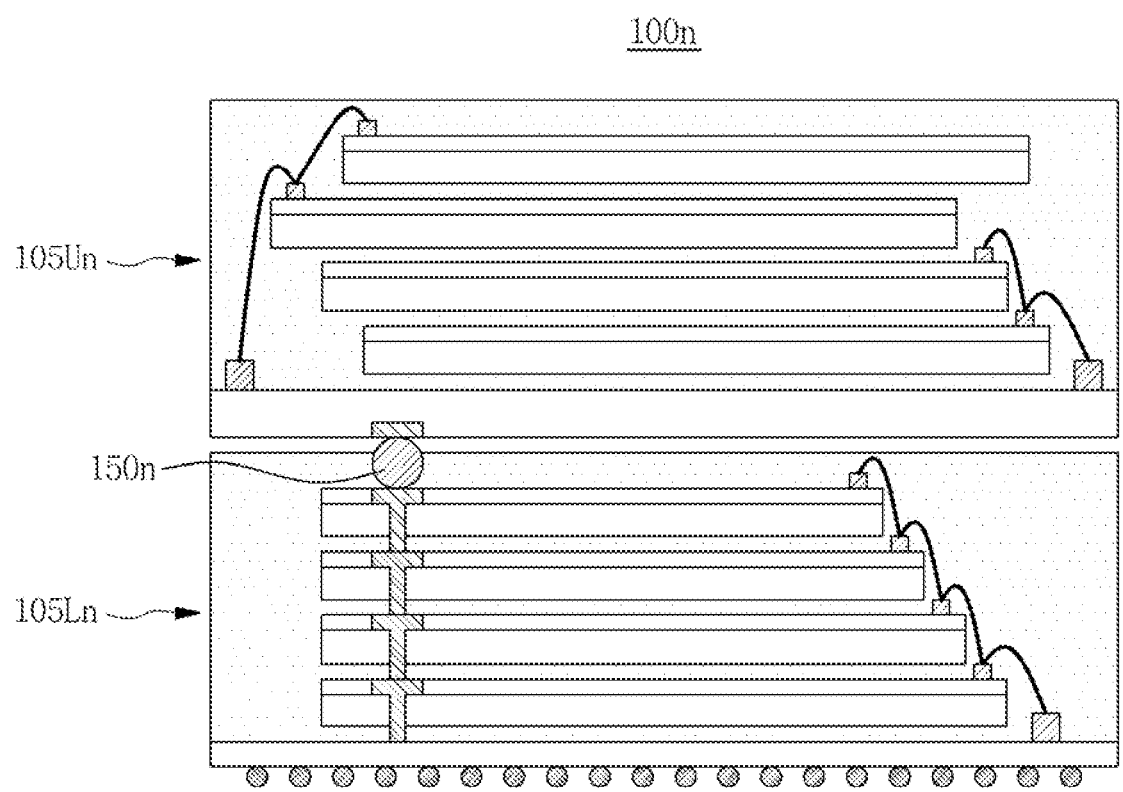

Referring to FIG. 4K, an upper semiconductor package 105Un may be understood with reference to upper semiconductor packages 105Uf and 105Uj of FIGS. 4C and 4G, and a lower semiconductor package 105Ln may be understood with reference to the lower semiconductor packages 105Uk, 105Ul and 105Um of FIGS. 4H to 4J.

Furthermore, the upper and lower semiconductor chips illustrated in FIGS. 3A and 3B may be applied to stacked structures of semiconductor packages having different forms. According to exemplary embodiments of the present invention, parts electrically connected to each other through the inter-package connectors may be arranged vertically. For example, the via pads of the lower semiconductor chip disposed on the uppermost part of the lower semiconductor chips may be vertically arranged with respect to the upper connection lands of the upper semiconductor package.

According to an exemplary embodiment, each of the semiconductor chips 120 may selectively include through-silicon vias 140. The semiconductor chips 120 may be selectively and electrically connected to the through-silicon vias 140. The through-silicon vias 140 selectively and electrically connected to the semiconductor chips 120 may transmit an electrical signal that is commonly connected to or used in the semiconductor chips 120. For example, a power voltage, a ground voltage, a clock signal or a chip selection signal may be transferred.

Figure 5A:
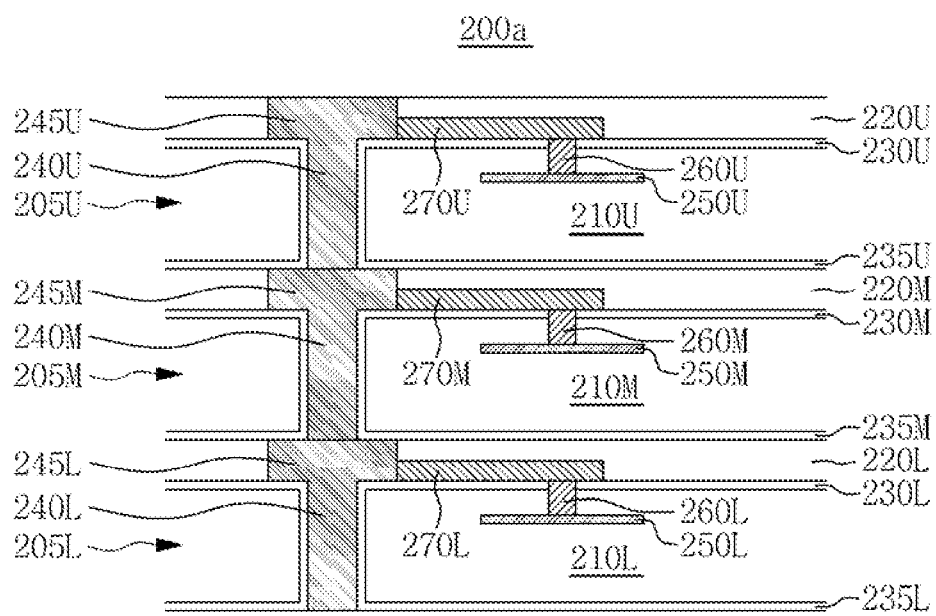
FIGS. 5A and 5C are schematic cross-sectional views of a semiconductor-chip stacked structure according to an exemplary embodiment of the present invention.
Figure 5B:
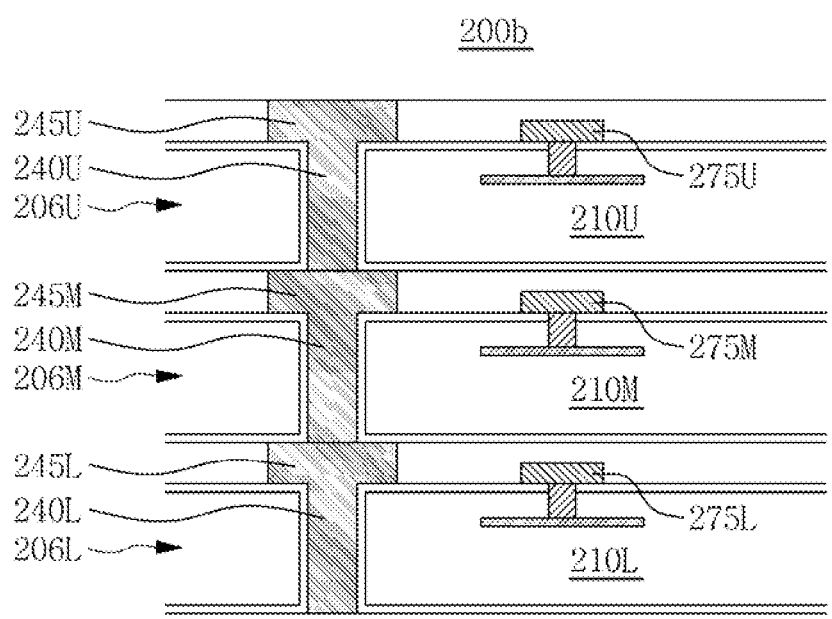

FIGS. 5A and 5B are schematic cross-sectional views of a semiconductor-chip stacked structure according to an exemplary embodiment. Referring to FIG. 5A, a semiconductor-chip stacked structure 200a includes a plurality of stacked semiconductor chips 205U, 205M, and 205L. The semiconductor chips 205U, 205M, and 205L include: internal circuit regions 210U, 210M, and 210L, respectively; chip redistribution layers 220U, 220M, and 220L, respectively; insulating layers 230U, 230M, and 230L, respectively; through-silicon vias 240U, 240M, and 240L, respectively; via pads 245U, 245M, and 245L, respectively, internal circuit interconnections 250U, 250M, and 250L, respectively; internal circuit vias 260U, 260M, and 260L, respectively; and redistribution interconnections 270U, 270M, and 270L, respectively. The through-silicon vias 240U, 240M, and 240L may be electrically connected to the via pads 245U, 245M, and 245L, respectively. The internal circuit interconnections 250U, 250M, and 250L, the internal circuit vias 260U, 260M, and 260L, and the redistribution interconnections 270U, 270M, and 270L may be electrically connected to each other. Moreover, the via pads 245U, 245M, and 245L may be electrically connected to the redistribution interconnections 270U, 270M, and 270L, respectively. In the internal circuit regions 210U, 210M, and 210L, a semiconductor circuit including a transistor is formed. The redistribution interconnections 270U, 270M, and 270L included in the chip redistribution layers 220U, 220M, and 220L may electrically connect the internal circuit regions 210U, 210M, and 210L to the outside. The insulating layers 230U, 230M, and 230L may be formed between the internal circuit regions 210U, 210M, and 210L and the chip redistribution layers 220U, 220M, and 220L. Moreover, the insulating layers 230U, 230M, and 230L may be formed between the internal circuit regions 210U, 210M, and 210L and the through-silicon vias 240U, 240M, and 240L as well. In addition, inter-chip insulating layers 235U, 235M, and 235L may be formed between the semiconductor chips 205U, 205M, and 205L. The inter-chip insulating layers 235U, 235M, and 235L may be formed of a molding material having adhesive properties. The through-silicon vias 240U, 240M, and 240L penetrate the internal circuit regions 210U, 210M, and 210L, respectively, but are not directly and electrically connected to the internal circuit regions 210U, 210M, and 210L. For example, the insulating layers 230U, 230M, and 230L are formed between the through-silicon vias 240U, 240M, and 240L and the internal circuit regions 210U, 210M, and 210L to be electrically insulated. The via pads 245U, 245M, and 245L may be electrically connected to the through-silicon vias 240U, 240M, and 240L, and may be partially formed in the chip redistribution layers 220U, 220M, and 220L. Surfaces of the via pads 245U, 245M, and 245L may be exposed to the outside of the chip redistribution layers 220U, 220M, and 220L. The internal circuit interconnections 250U, 250M, and 250L are illustrated in a simplified way, and may be electrically connected to semiconductor circuits included in the internal circuit regions 210U, 210M, and 210L. The internal circuit vias 260U, 260M, and 260L may electrically connect the internal circuit interconnections 250U, 250M, and 250L to the redistribution interconnections 270U, 270M, and 270L, respectively. The redistribution interconnections 270U, 270M, and 270L may be formed in all or a part of the chip redistribution layers 220U, 220M, and 220L. The redistribution interconnections 270U, 270M, and 270L may be electrically connected to the via pads 245U, 245M, and 245L. The through-silicon vias 240U, 240M, and 240L of the plurality of stacked semiconductor chips 205U, 205M, and 205L may be electrically connected to each other. Therefore, the internal circuit regions 210U, 210M, and 210L of the plurality of stacked semiconductor chips 205U, 205M, and 205L may be electrically connected to the through-silicon vias 240U, 240M, and 240L. This shape may be individually or commonly applied to FIGS. 1 to 4K. According to an exemplary embodiment, for example, upper semiconductor packages 105Ux of FIGS. 1 to 4K may include this structure.

Referring to FIG. 5B, redistribution interconnections 275U, 275M, and 275L are electrically insulated from via pads 245U, 245M, and 245L. For example, through-silicon vias 240U, 240M, and 240L are electrically insulated from internal circuit regions 210U, 210M, and 210L. In this structure, an electrical signal that the semiconductor chips 206U, 206M, and 206L do not require may be transferred to another semiconductor chip. According to an exemplary embodiment, for example, the lower semiconductor packages 105Lx illustrated in FIGS. 1 to 4K may include this structure.

Figure 5C:
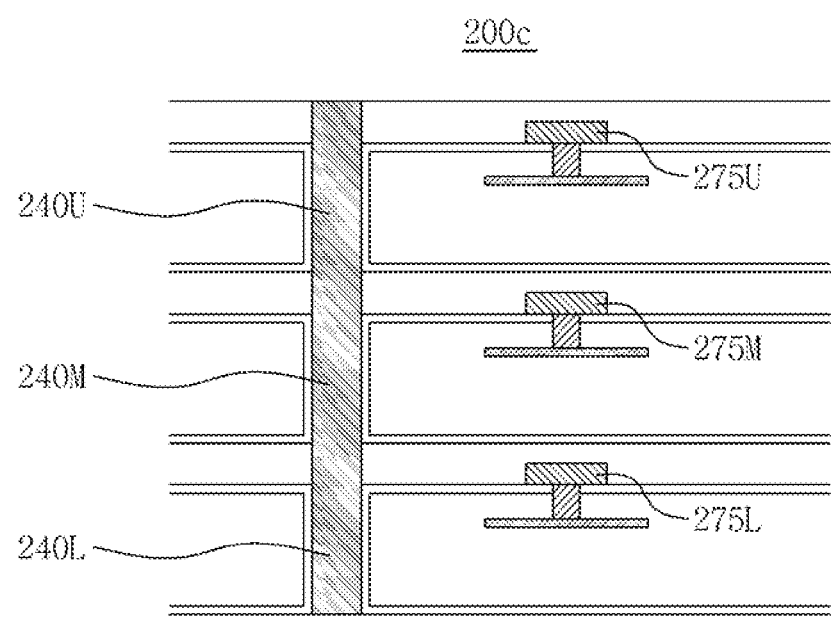

Referring to FIG. 5C, through-silicon vias 240U, 240M, and 240L are arranged vertically and via pads are not formed. For example, when the through-silicon vias 240U, 240M, and 240L are electrically insulated from redistribution interconnections 275U, 275M, and 275L, via pads need not be formed. In the drawings for describing exemplary embodiments, through-silicon vias 240U, 240M, and 240L and via pads may be formed as illustrated in FIG. 5C. For example, in the drawings for describing exemplary embodiments, via pads need not be formed. Through-silicon vias 240U, 240M, and 240L may be arranged vertically to be directly and physically connected to each other.

Figure 6A:
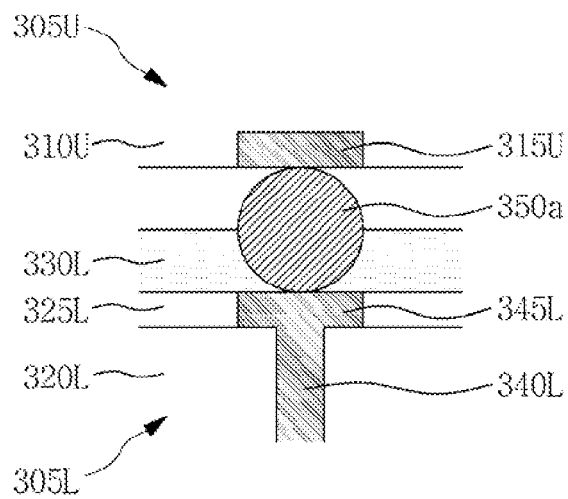
FIGS. 6A to 6C are schematic cross-sectional views of inter-package connectors according to an exemplary embodiment of the present invention.
Figure 6B:
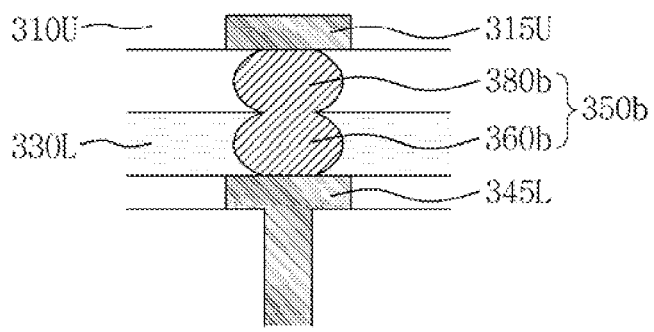
Figure 6C:
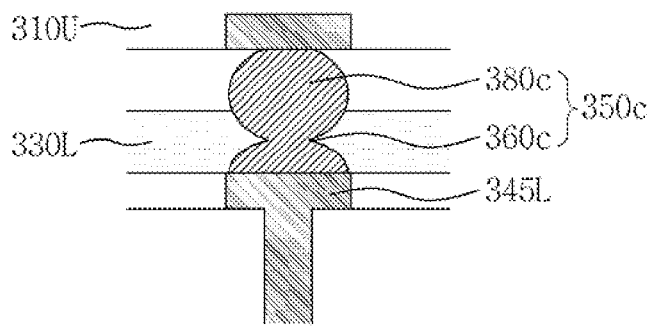

FIGS. 6A to 6C are schematic cross-sectional views of inter-package connectors according to an exemplary embodiment of the present invention. The inter-package connectors 350a to 350c may electrically connect lower via pads 345L formed in a chip redistribution layer 325L of a lower semiconductor chip 320L disposed on the uppermost part of the lower semiconductor package 305L to upper connection lands 315U formed on a bottom surface of an upper package substrate 310U of an upper semiconductor package 305U, respectively. The lower via pads 345L may be electrically connected to upper through-silicon vias 340L.

Referring to FIG. 6A, an inter-package connector 350a may be formed in the shape of a sphere. For example, the lower molding material 330L may be patterned such that a top surface of the lower via pad 345L of the uppermost lower semiconductor chip 320L may be exposed. The inter-package connector 350a formed on the connection land 315U of the upper semiconductor package 305U may be disposed to be electrically connected to the exposed lower via pad 345L.

Referring to FIG. 6B, an inter-package connector 350b may include a lower connector 360b and an upper connector 380b. The lower connector 360b and the upper connector 380b may be formed using a soldering process. In the drawing, an exemplary shape is illustrated and the final shape may be made with reference to FIG. 6A. For example, it is conceptually described that the upper semiconductor package 305U and the lower semiconductor package 305L may independently have the lower connector 360b and the upper connector 380b, respectively. In addition, the lower connector 360b may be formed on the via pad 345L, and the upper connector 380b may be attached to the upper package substrate 310U such that they are electrically connected to each other. The lower connector 360b may be formed before the lower molding material 330L is formed. For example, the lower molding material 330L may be formed surrounding a side of the lower connector 360b and may cover a top surface thereof.

Referring to FIG. 6C, an inter-package connector 350c may be formed of a lower connector 360c in the shape of a hemisphere and an upper connector 380c in the shape of a sphere. The lower connector 360c in the shape of a hemisphere may be formed on a via pad 345c disposed on the uppermost part of the lower connector 360c in the shape of a hemisphere. A top surface of the lower connector 360c in the shape of a hemisphere may be covered with the lower molding material 330L. The upper connector 380c in the shape of a sphere may be attached to the upper package substrate 310U to implement the illustrated connection structure. The lower connector 360c in the shape of a hemisphere and the upper connector 380c in the shape of a sphere may be formed through a soldering process.

FIGS. 7A to 7E are cross-sectional views illustrating a method of forming a stacked structure of semiconductor packages according to an exemplary embodiment of the present invention. The semiconductor package described below may be an upper semiconductor package or a lower semiconductor package. Parts that have not been described may be understood by those of ordinary skill in the art in light of the remainder of the disclosure.

Figure 7A:
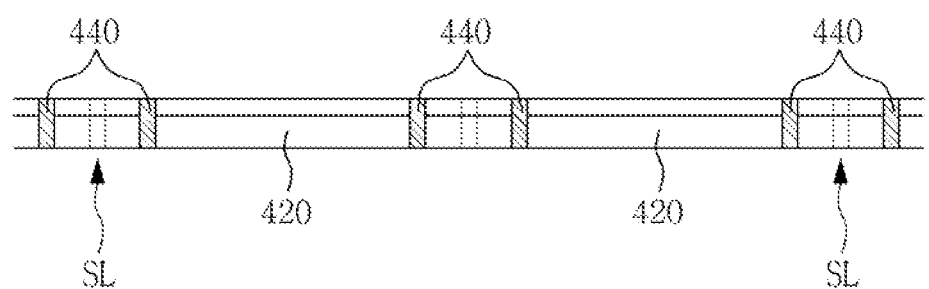
FIGS. 7A to 7E are cross-sectional views illustrating a method of forming a stacked structure of semiconductor packages according to an exemplary embodiment of the present invention.

Referring to FIG. 7A, a process of forming semiconductor chips 420 on a wafer is performed and through-silicon vias 440 are formed through each semiconductor chip 420. An imaginary cutting line, for example, scribe lane SL, may represent a path along which the semiconductor chips 420 are divided by sawing. In the through-silicon vias 440, a via hole is formed through a laser drilling process or an etching process, and a via plug filling the hole is formed through a plating process or a filling process, so that the through-silicon vias 440 may be formed.

Figure 7B:
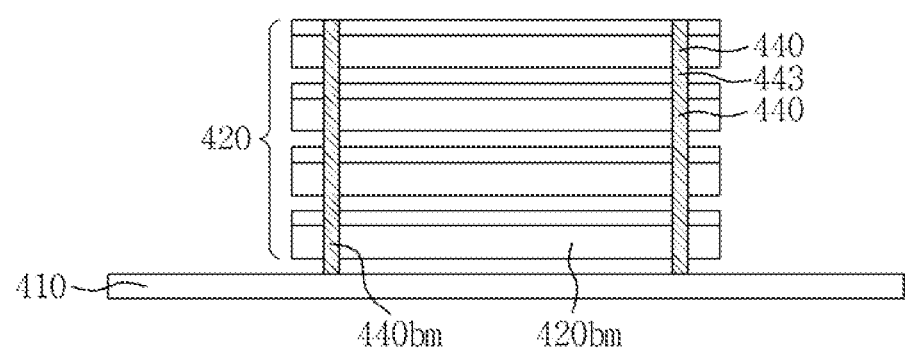

Referring to FIG. 7B, the semiconductor chips 420 on the wafer are divided into individual semiconductor chips 420 through a sawing process and the divided results are stacked on a package substrate 410. When the semiconductor chips 420 are stacked, a conductive adhesive material 443 may be formed between the through-silicon vias 440. For example, a solder, etc. may be formed. In addition, the through-silicon vias 440 may be formed to protrude from the top or bottom surfaces of the semiconductor chips 420. Furthermore, the package substrate 410 may be electrically connected to a lowermost through-silicon via 440bm of a semiconductor chip 420bm disposed on the lowermost part of the semiconductor chips 420.

Figure 7C:
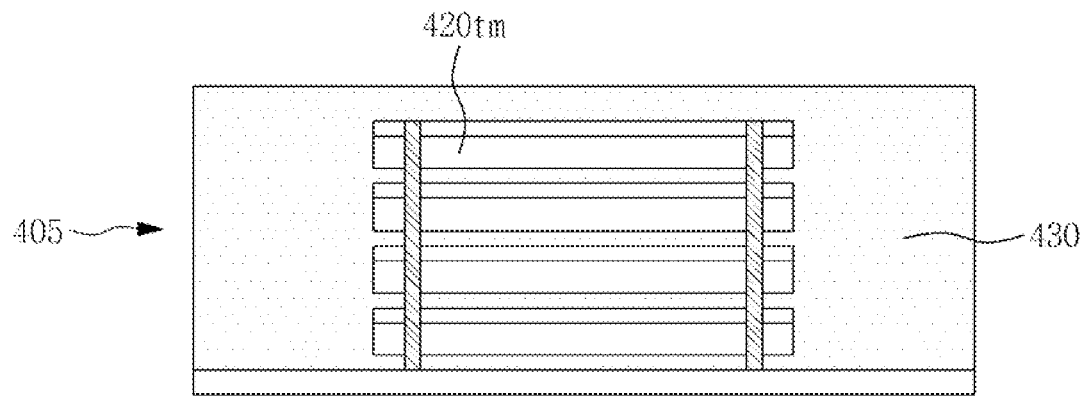

Referring to FIG. 7C, a molding material 430 covering the semiconductor chips 420 may be formed on the package substrate 410. The molding material 430 may be formed to cover a top surface of a semiconductor chip 420tm disposed on the uppermost part of the semiconductor chips 420. As a result of the process, a unit semiconductor package 405 may be formed.

Figure 7D:
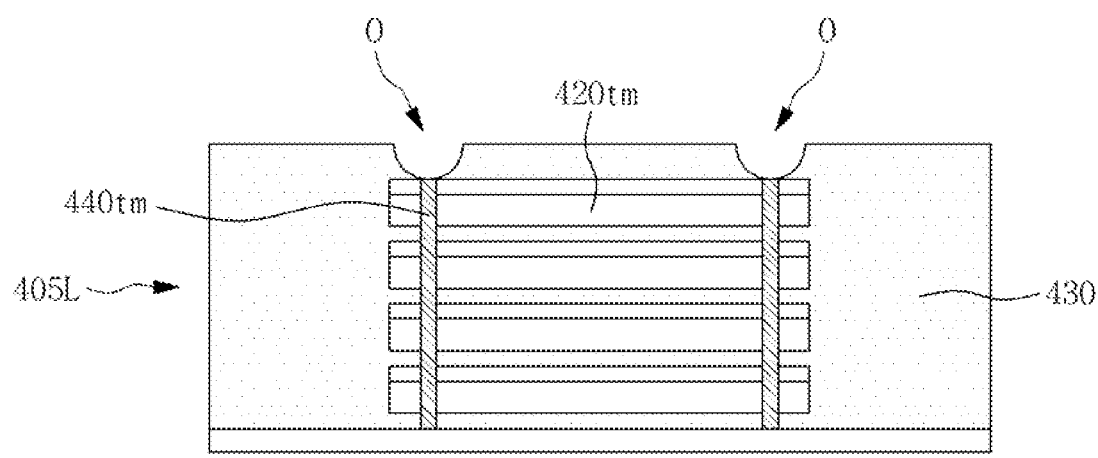

Referring to FIG. 7D, openings O are formed in the molding material 430 such that a surface of an uppermost through-silicon via 440tm included in the uppermost semiconductor chip 420tm protrudes. The opening may be formed using a laser process. Photosensitive polyimide, etc. may be formed on the molding material 430 and a photolithography process may be used to expose a surface of the molding material 430 where the openings O will be formed. The semiconductor package 405L illustrated in the drawing may be a lower semiconductor package 405L.

Figure 7E:
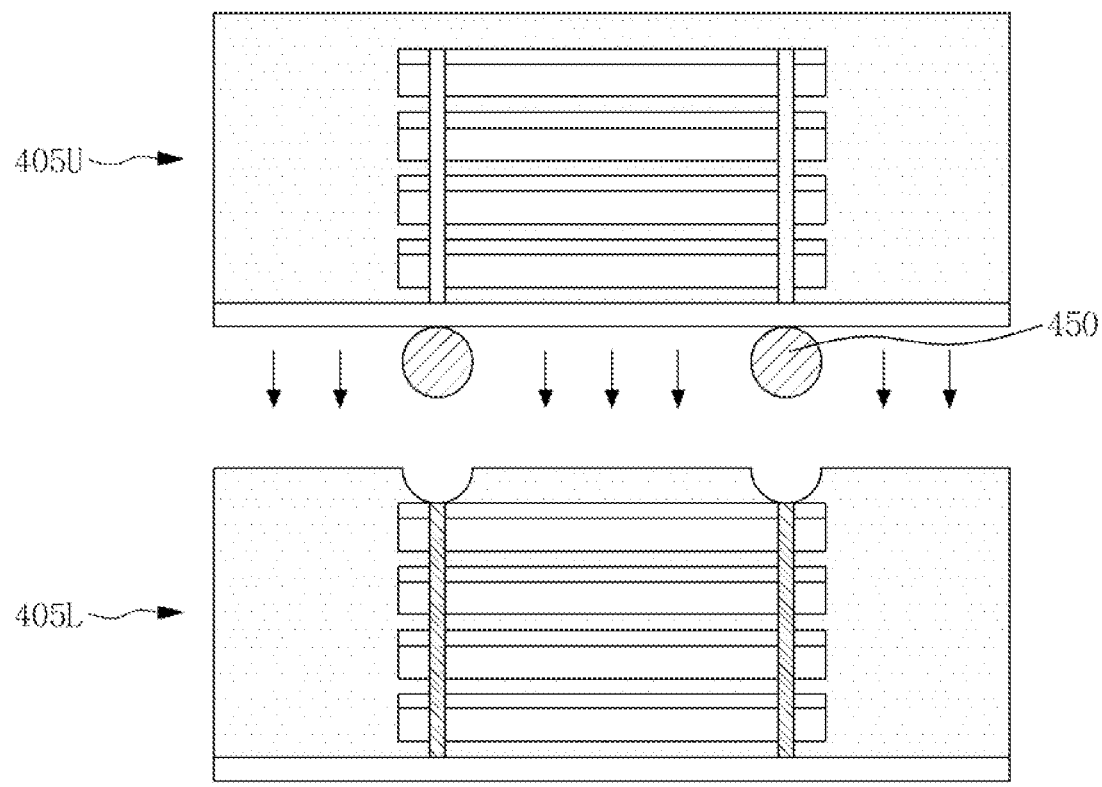

Referring to FIG. 7E, an upper semiconductor package 405U in which inter-package connectors 450 are formed is combined with a lower semiconductor package 405L in which the openings O are formed. The inter-package connectors 450 are arranged with the openings O. As a result, a stacked structure of semiconductor packages according to an exemplary embodiment of the present invention may be completed.

Figure 8A:
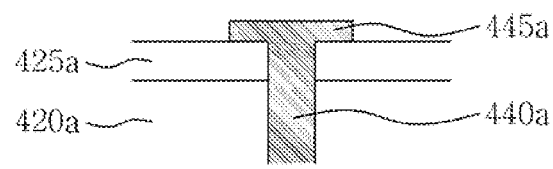
FIGS. 8A and 8B are schematic cross-sectional views of shapes of through-silicon vias and via pads according to an exemplary embodiment of the present invention.
Figure 8B:
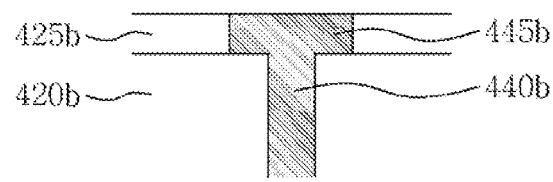

FIGS. 8A and 8B are schematic cross-sectional views illustrating shapes of through-silicon vias and via pads according to an exemplary embodiment of the present invention. Referring to FIG. 8A, a through-silicon via 440a is formed that penetrates a semiconductor chip 420a and a via pad 445a is formed thereon. In the drawing, it is illustrated that after a chip redistribution layer 425a is formed, the through-silicon via 440a may be formed.

Referring to FIG. 8B, a via pad 445b is formed at the same height as a chip redistribution layer 425b. In the drawing, the through-silicon via 440b shows that after the semiconductor chip 420b is formed, the chip redistribution layer 425b may be formed. The shapes of the formed chip though silicon vias and via pads, which are illustrated in FIGS. 1 to 6F, may be understood by one of ordinary skill in the art in light of the combination of FIGS. 7A, 8A, and 8B.

Figure 9A:
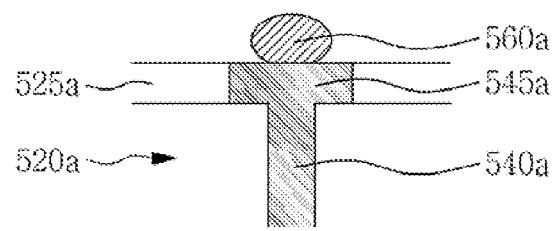
FIGS. 9A to 10C are schematic diagrams illustrating various methods of forming inter-package connectors according to an exemplary embodiment of the present invention.

FIGS. 9A to 10C schematically illustrate various methods of forming inter-package connectors according to an exemplary embodiment of the present invention. Referring to FIG. 9A, a lower connector 560a is formed on a via pad 545a formed in a chip redistribution layer 525a of a semiconductor chip 520a having a through-silicon via 540a. The lower connector 560a may be formed through a soldering process.

Figure 9B:
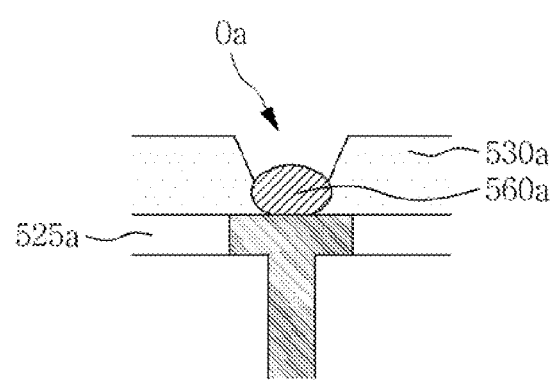

Referring to FIG. 9B, a molding material 530a is formed on the chip redistribution layer 525a. The molding material 530a may include an opening Oa partially exposing a top surface of the lower connector 560a.

Figure 9C:
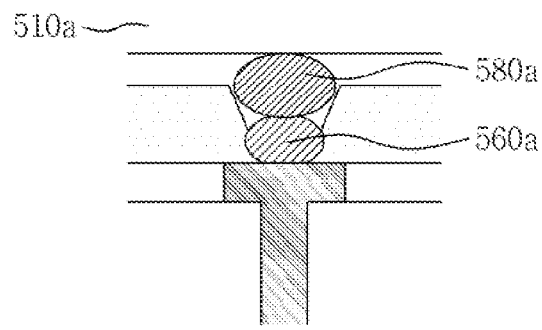

Referring to FIG. 9C, an upper connector 580a is formed on the lower connector 560a exposed in the opening Oa. The upper connector 580a may be attached to an upper package substrate 510a. The lower connector 560a and the upper connector 580a may each be formed in the shape of a sphere. Finally, the lower connector 560a and the upper connector 580a may be in an integrated shape. For example, boundaries of the two elements may disappear.

Figure 10A:
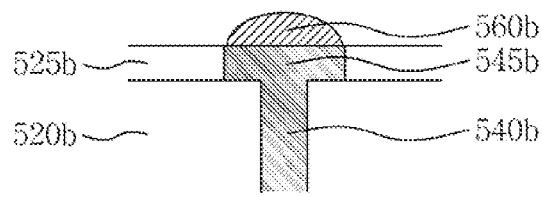

Referring to FIG. 10A, a lower connector 560b in the shape of a hemisphere is formed on a via pad 545b formed in a chip redistribution layer 525b of a semiconductor chip 520b having a through-silicon via 540b. The lower connector 560b in the shape of a hemisphere may be formed through a soldering process.

Figure 10B:
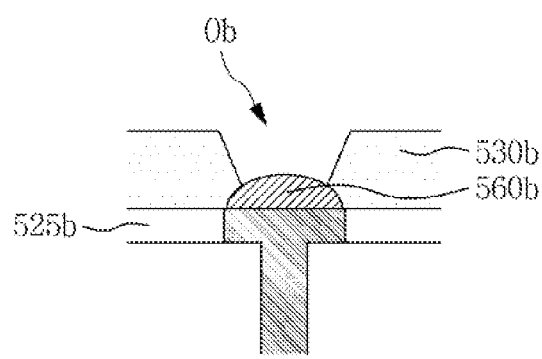

Referring to FIG. 10B, a molding material 530b is formed on the chip redistribution layer 525b and the lower connector 560b in the shape of a hemisphere. The molding material 530b may include an opening Ob partially exposing a top surface of the lower connector 560b in the shape of a hemisphere.

Figure 10C:
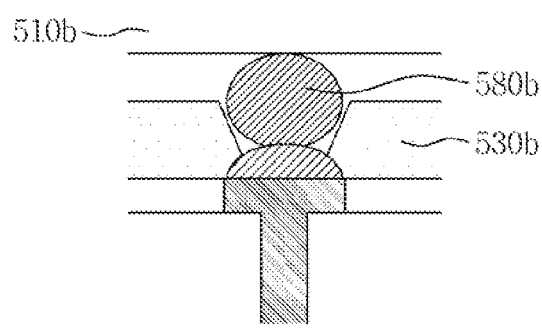

Referring to FIG. 10C, an upper connector 580b in the shape of a sphere is formed on the lower connector 560b in the shape of a hemisphere exposed in the opening Ob. The upper connector 580b in the shape of a sphere may be attached to an upper package substrate 510b. A boundary between the lower connector 560b in the shape of a hemisphere and the upper connector 580b in the shape of a sphere may be an imaginary boundary. When the two elements are formed of the same material, e.g., a solder material, the boundary between the two elements may be arbitrary.

Figure 11:
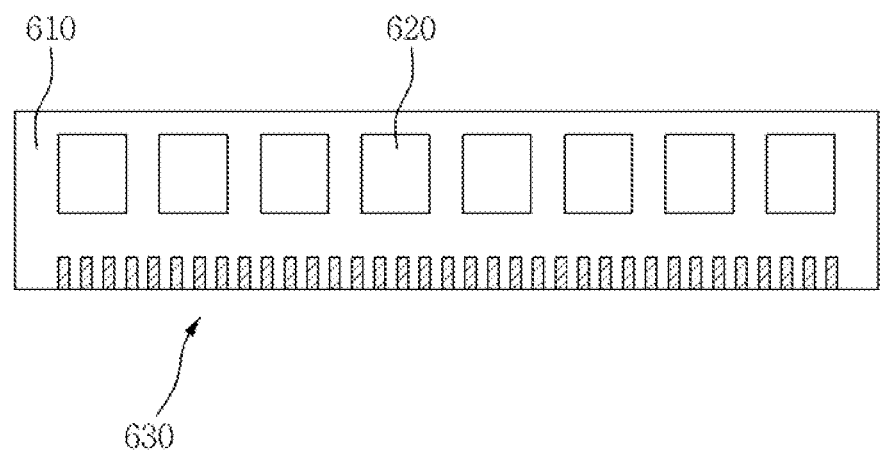
FIG. 11 is a schematic plan view of a semiconductor module including a semiconductor device according to an exemplary embodiment of the present invention.

FIG. 11 is a schematic plan view of a semiconductor module including a semiconductor device according to an exemplary embodiment of the present invention. Referring to FIG. 11, a semiconductor module 600 according to an exemplary embodiment includes a module substrate 610, a plurality of semiconductor devices 620 disposed on the module substrate 610, and module contact terminals 630 formed to be parallel to one edge of the module substrate 610 and electrically connected to the semiconductor devices 620, respectively. The module substrate 620 may be a printed circuit board (PCB). Both sides of the module substrate 610 may be used. For example, the semiconductor devices 620 may be disposed on front and rear sides of the module substrate 610. While it is illustrated that the eight semiconductor devices 620 are disposed on a front side of the module substrate 610 in FIG. 11, this is but one exemplary arrangement. Also, a separate semiconductor device for controlling semiconductor devices or semiconductor packages may be further included. Therefore, a semiconductor module 600 is not limited to the number and arrangement of semiconductor devices 620 illustrated in FIG. 11. At least one of the semiconductor devices 620 may be one of stacked structures 100a to 100n of semiconductor packages according to exemplary embodiments. The module contact terminals 630 may be formed of a metal and may have oxidation resistance. The module contact terminals 630 may be variously set depending on the standard specification of the semiconductor module 600. Therefore, the number of illustrated module contact terminals 630 may be varied.

Figure 12:
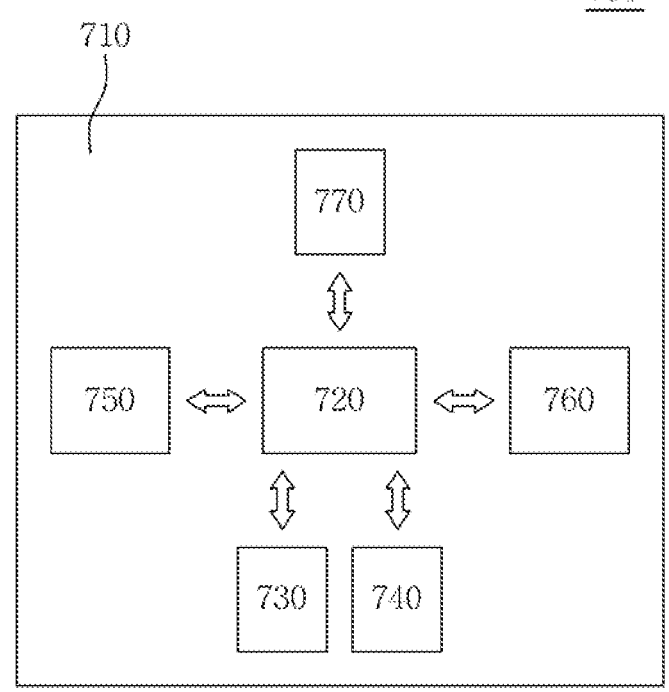
FIG. 12 is a schematic block diagram of an electronic circuit board according to an exemplary embodiment of the present invention.

FIG. 12 is a schematic block diagram of an electronic circuit board according to an exemplary embodiment of the present invention. Referring to FIG. 12, an electronic circuit board 700 according to an exemplary embodiment includes a microprocessor 720 disposed on a circuit board 710, a main storage circuit 730, and a supplementary storage circuit 740 communicating with the microprocessor 720, an input signal processing circuit 750 transmitting a command to the microprocessor 720, an output signal processing circuit 760 receiving a command from the microprocessor 720, and a communicating signal processing circuit 770 transmitting and receiving an electrical signal to/from other circuit boards. It may be understood that arrows denote a route by which an electrical signal may be transferred. The microprocessor 720 may receive and process various electrical signals, output the results, and control the other elements of the electronic circuit board 700. For example, it may be understood that the microprocessor 720 corresponds to a central processing unit (CPU) and/or a main control unit (MCU). The main storage circuit 730 may temporarily store data that the microprocessor 720 always or frequently requires or data before and after processing. The main storage circuit 730 requires a high-speed response, and thus may be formed of a semiconductor memory. For example, the main storage circuit 730 may be formed of a semiconductor memory referred to as a cache, a static random access memory (SRAM), a dynamic random access memory (DRAM), a resistive random access memory (RRAM) and applied semiconductor memories thereof, e.g., Utilized RAM, Ferro-electric RAM, Fast cycle RAM, Phase changeable RAM, Magnetic RAM, and other semiconductor memories. Furthermore, the main storage circuit is not limited to a volatile or non-volatile circuit, and may include a random access memory. According to an exemplary embodiment, the main storage circuit 730 may include at least one of stacked structures 100a to 100n of semiconductor packages and a semiconductor module 600. The supplementary storage circuit 740 is a high-capacity memory device and may be a non-volatile semiconductor memory such as a flash memory or a hard disk drive using a magnetic field to store and read data. Alternatively, the supplemental storage circuit 740 may be a compact disk drive using light to store and read data. Compared with the main storage circuit 730, the supplementary storage circuit 740 does not require high speed, but it may be used to store high-capacity data. The supplementary storage circuit 740 is not limited to random access or non-random access, and may include a non-volatile memory device. The supplementary storage circuit 740 may include at least one of the stacked structures 100a to 100n of semiconductor packages and the semiconductor module 600 according to an exemplary embodiment. The input signal processing circuit 750 may convert an external command into an electrical signal or transfer an externally received electrical signal to the microprocessor 720. The externally received command or electrical signal may be an operation command, an electrical signal to be processed, or data to be stored. The input signal processing circuit 750, e.g., may be a terminal signal processing circuit processing a signal transmitted from a keyboard, a mouse, a touch pad, an image recognition device or various sensors, an image signal processing circuit processing an input of an image signal from a scanner or a camera, or various sensors or input signal interfaces. The input signal processing circuit 750 may include at least one of the stacked structures 100a to 100n of semiconductor packages and the semiconductor module 600 according to an exemplary embodiment. The output signal processing circuit 760 may be an element for externally transmitting an electrical signal processed by the microprocessor 720. For example, the output signal processing circuit 760 may be a graphics card, an image processor, an optical converter, a beam panel card, or an interface circuit of various functions. The output signal processing circuit 760 may include at least one of the stacked structures 100a to 100n of semiconductor packages and the semiconductor module 600 according to an exemplary embodiment. The communicating signal processing circuit 770 is an element for directly transmitting or receiving an electrical signal to/from other electronic systems or other circuit boards without using the input signal processing circuit 750 and the output signal processing circuit 760. For example, the communicating circuit 770 may be a modem of a personal computer system or various interface circuits. The communicating circuit 770 may include at least one of the stacked structures 100a to 100n of semiconductor packages and the semiconductor module 600 according to an exemplary embodiment.

Figure 13:
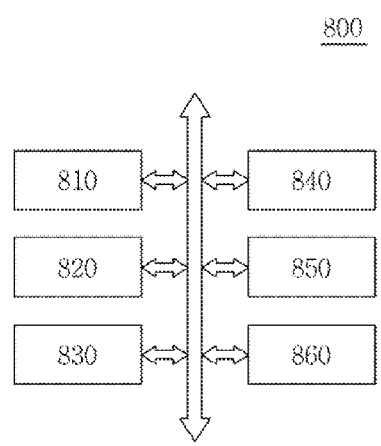
FIG. 13 is a schematic block diagram of an electronic system according to an exemplary embodiment of the present invention.

FIG. 13 is a schematic block diagram of an electronic system according to an exemplary embodiment of the present invention. Referring to FIG. 13, an electronic system 800 according to an exemplary embodiment may further include a control unit 810, an input unit 820, an output unit 830, a storage unit 840, a communication unit 850 and/or an operation unit 860. The control unit 810 may generally control the electronic system 800 and each unit. The control unit 810 may be understood as a central processing unit or a central control unit, and may include the electronic circuit board 700 according to an exemplary embodiment. Also, the control unit 810 may include at least one of the stacked structures 100a to 100n of semiconductor packages and the semiconductor module 600 according to an exemplary embodiment. The input unit 820 may transmit an electrical command signal to the control unit 810. The input unit 820 may be a keyboard, a mouse, a touch pad, an image recognition device such as a scanner or various input sensors. The input unit 820 may include at least one of the stacked structures 100a to 100n of semiconductor packages and the semiconductor module 600 according to an exemplary embodiment. The output unit 830 may receive an electrical command signal from the control unit 810, and may output the result processed by the electronic system 800. The output unit 830 may be a monitor, a printer, a beam irradiator or various mechanical devices. The output unit 830 may include at least one of the stacked structures 100a to 100n of semiconductor packages and the semiconductor module 600 according to an exemplary embodiment. The storage unit 840 may be an element for temporarily or permanently storing an electrical signal to be processed or processed by the control unit 810. The storage unit 840 may be physically or electrically combined with the control unit 810. The storage unit 840 may be a semiconductor memory, a magnetic memory device such as a hard disk drive, an optical storage device such as a compact disk drive or a server having a data storage function. Furthermore, the storage unit 840 may include at least one of the stacked structures 100a to 100n of semiconductor packages and the semiconductor module 600 according to an exemplary embodiment. The communication unit 850 may receive an electrical command signal from the control unit 810 and may transmit or receive the received electrical signal to/from other electronic systems. The communication unit 850 may be a wired transceiver such as a modem and a LAN card, a wireless transceiver such as WiBro interface or an infrared port. Moreover, the communication unit 850 may include at least one of the stacked structures 100a to 100n of semiconductor packages and the semiconductor module 600 according to an exemplary embodiment. The operation unit 860 may physically or mechanically operate according to a command of the control unit 810. For example, the operation unit 860 may be, an element that mechanically operates such as a floater, an indicator, or an up/down operator. The electronic system according to an exemplary embodiment may be a computer, a network server, a networking printer or scanner, a wireless controller, a mobile communication terminal, an exchanger, or an electronic product that performs programmed operations.

As described above, according to an exemplary embodiment, a high-capacity semiconductor device operating at high speed, e.g., a stacked structure of semiconductor packages can be implemented, and additionally, a semiconductor module, an electronic circuit board, and an electronic system can be implemented.

In addition, names and functions of other elements not denoted by reference numerals in the drawings may be understood with reference to the other drawings and the descriptions thereof.

The foregoing is illustrative of exemplary embodiments and is not to be construed as limiting thereof. Although a few exemplary embodiments have been described, those skilled in the art will readily appreciate that many modifications are possible. Therefore, it is to be understood that the foregoing is illustrative of various exemplary embodiments and is not to be construed as limited to the specific embodiments disclosed, and that modifications to the disclosed embodiments, as well as other embodiments, are intended to be included within the scope of the present application.

What is claimed is:

1. A stacked structure of semiconductor packages, comprising:
   an upper semiconductor package;
   a lower semiconductor package; and
   a plurality of inter-package connectors located between the upper semiconductor package and the lower semiconductor package,
   wherein the upper semiconductor package includes:
   an upper package substrate;
   a plurality of upper semiconductor chips stacked on the upper package substrate; and
   one or more conductive upper connection lands formed on a bottom surface of the upper package substrate,
   wherein the lower semiconductor package includes:
   a lower package substrate;
   a plurality of lower semiconductor chips stacked on the lower package substrate; and
   at least one lower through-silicon vias vertically penetrating one or more of the lower semiconductor chips, and
   wherein each of the plurality of inter-package connectors is electrically connected to at least one of the plurality of upper connection lands, and
   wherein the upper semiconductor package, the lower semiconductor package, and the plurality of inter-package connectors are part of a control unit, an input unit, an output unit, or a storage unit that are included in an electronic system.

2. The structure of claim 1, wherein the upper semiconductor chips and the lower semiconductor chips are each memory storage integrated circuits.

3. The structure of claim 1, wherein the lower through-silicon vias are electrically insulated from the lower semiconductor chips.

4. The structure of claim 1, wherein the lower through-silicon vias transfer a power voltage, a ground voltage, a clock signal, or a chip selection signal.

5. The structure of claim 1, wherein an uppermost lower semiconductor chip of the plurality of lower semiconductor chips is stacked on an uppermost part of the lower semiconductor chips and includes uppermost via pads formed on the top surface of the uppermost part of the lower semiconductor chips.

6. The structure of claim 5, wherein the uppermost via pads are electrically connected to the lower through-silicon vias.

7. The structure of claim 5, wherein a layout of the upper connection lands is aligned with that of the inter-package connectors.

8. The structure of claim 7, wherein a layout of the inter-package connectors is aligned with that of the uppermost via pads.

9. The structure of claim 5, wherein the lower semiconductor chips include via pads formed on top surfaces thereof, respectively, and the via pads are electrically connected to the lower through-silicon vias.

10. The structure of claim 1, wherein the lower semiconductor package further includes a lower molding material formed on the lower semiconductor chips.

11. The structure of claim 10, wherein the lower molding material includes openings exposing surfaces of the uppermost via pads.

12. The structure of claim 1, wherein the upper semiconductor package includes upper through-silicon vias vertically penetrating the upper semiconductor chips.

13. The structure of claim 12, wherein the upper through-silicon vias are electrically connected to the upper connection lands.

14. The structure of claim 13, wherein the upper through-silicon vias are electrically connected to the upper semiconductor chips.

15. The structure of claim 1, wherein the upper semiconductor chips include upper bonding pads.

16. The structure of claim 15, wherein the upper package substrate includes upper wire lands electrically connected to the upper bonding pads.

17. The structure of claim 16, wherein the upper wire lands are electrically connected to the upper connection lands.

18. The structure of claim 1, wherein the lower semiconductor package further includes a lower molding enclosing the plurality of lower semiconductor chips and each of the plurality of inter-package connectors is substantially spherically shaped, is in electrical contact with the at least one through-silicon vias of the lower semiconductor package, and penetrates and rises above a top surface of the lower molding.

19. A stacked structure of semiconductor packages, comprising:
   an upper semiconductor package;
   a lower semiconductor package; and
   a plurality of inter-package connectors located between the upper semiconductor package and the lower semiconductor package,
   wherein the upper semiconductor package includes:
   an upper package substrate;
   a plurality of upper semiconductor chips stacked on the upper package substrate; and
   one or more conductive upper connection lands formed on a bottom surface of the upper package substrate,
   wherein the lower semiconductor package includes:
   a lower package substrate;
   a plurality of lower semiconductor chips stacked on the lower package substrate; and
   at least one lower through-silicon vias vertically penetrating one or more of the lower semiconductor chips, and
   wherein the plurality of inter-package connectors electrically connect the at least one through-silicon vias to at least one of the plurality of upper connection lands,
   wherein the upper semiconductor package, the lower semiconductor package, and the plurality of inter-package connectors are part of a semiconductor device which is part of a semiconductor module, the semiconductor module additionally including:
   a module substrate;
   a plurality of semiconductor devices, including the semiconductor device, disposed on the module substrate; and
   module contact terminals formed parallel to an edge of the module substrate and electrically connected to the semiconductor devices.

* * * * *